United States Patent

Arakawa et al.

[11] Patent Number: 5,973,929
[45] Date of Patent: Oct. 26, 1999

[54] PRINTED CIRCUIT BOARD HAVING AN EMBEDDED CAPACITOR

[75] Inventors: Tomoyasu Arakawa, Yokohama; Toru Otaki; Yasushi Takeuchi, both of Tokyo; Hideho Inagawa, Yokohama; Yoshimi Terayama, Odawara; Tohru Ohsaka, Yokohama, all of Japan

[73] Assignee: Canon Kabushiki Kaisha, Tokyo, Japan

[21] Appl. No.: 08/974,510

[22] Filed: Nov. 19, 1997

Related U.S. Application Data

[63] Continuation of application No. 08/423,687, Apr. 18, 1995, abandoned.

[30] Foreign Application Priority Data

| Apr. 21, 1994 | [JP] | Japan | 6-107628 |
| Apr. 28, 1994 | [JP] | Japan | 6-092254 |
| Apr. 4, 1995 | [JP] | Japan | 7-079067 |

[51] Int. Cl.$^6$ .............. H01G 4/35; H05K 1/16; H05K 1/11
[52] U.S. Cl. .............. 361/762; 361/302; 361/306.2; 361/761; 361/763; 361/782
[58] Field of Search .............. 174/255, 260, 174/261; 257/516, 528, 532, 535, 723, 724, 904; 333/181, 182, 183, 185, 172, 246, 247; 361/761–764, 766, 765, 782, 301.1, 321.45, 301.2, 302, 306.1, 306.2, 306.3; 428/901

[56] References Cited

U.S. PATENT DOCUMENTS

| Re. 35,064 | 10/1995 | Hernandez | 361/780 |
| 3,191,098 | 6/1965 | Fuller | 361/763 |
| 4,926,549 | 5/1990 | Yoshizawa et al. | 29/876 |
| 5,055,966 | 10/1991 | Smith et al. | 174/255 |
| 5,197,892 | 3/1993 | Yoshizawa et al. | 439/91 |

FOREIGN PATENT DOCUMENTS 3-245598   11/1991   Japan .................. 361/761

OTHER PUBLICATIONS

IBM Technical Disclosure Bulletin Multilayer Ceramic Sandwiches' by C. McIntosh vol. 16 No. 1 p. 43, Jun. 1973.

*Primary Examiner*—Donald Sparks
*Attorney, Agent, or Firm*—Fitzpatrick, Cella, Harper & Scinto

[57] ABSTRACT

A circuit board having a printed capacitor whose capacitance is easily adjusted includes a plurality of through-holes arranged in arrays and electrically connected to each other via conductive films. Therefore, first and second electrode portions are arranged to oppose each other, and form a printed capacitor. The capacitance of the capacitor can be adjusted by the number and diameter of through-holes, and the interval between each two adjacent through-holes. Therefore, even when a large-capacitance capacitor is to be formed, the printed capacitor can be rendered compact.

23 Claims, 28 Drawing Sheets

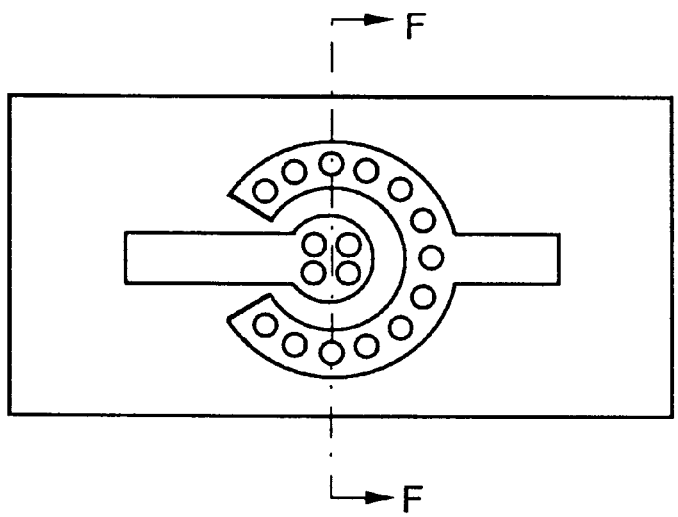
FIG. 25A
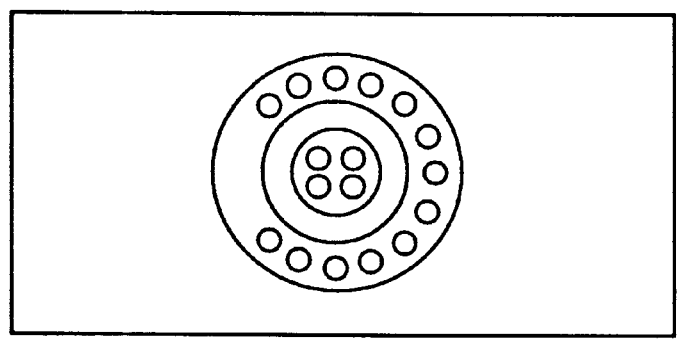
FIG. 25B
FIG. 25C
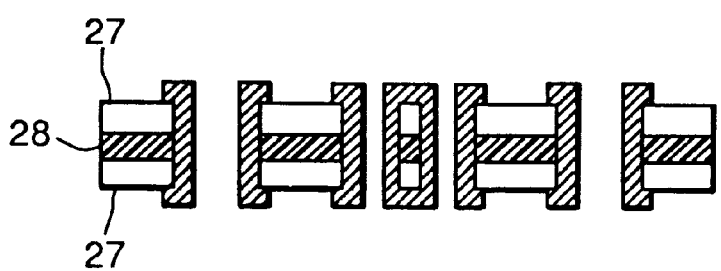

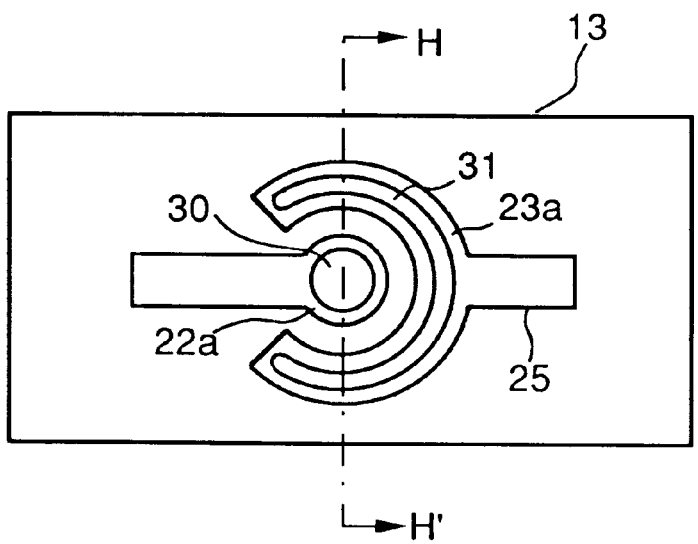
FIG. 33A
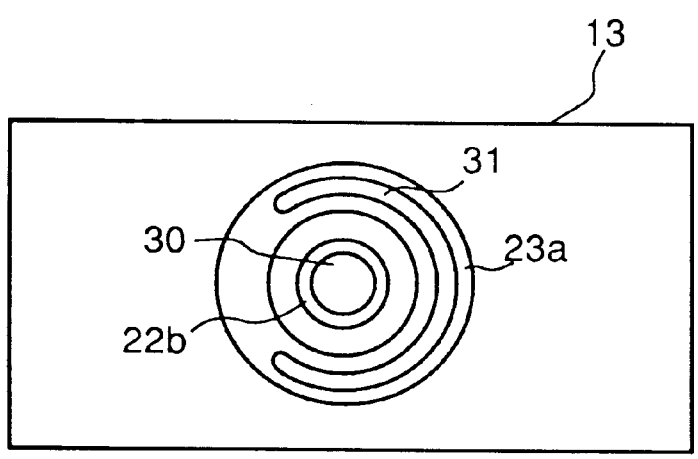
FIG. 33B
FIG. 33C
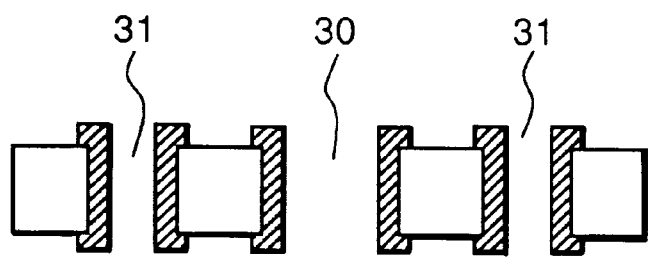

PRINTED CIRCUIT BOARD HAVING AN EMBEDDED CAPACITOR

This application is a continuation of application Ser. No. 08/423,687, filed Apr. 18, 1997, now abandoned.

BACKGROUND OF THE INVENTION

The present invention relates to a printed circuit board and, more particularly, to a printed circuit board in which a capacitor is three-dimensionally formed in a substrate.

Conventionally, various types of so-called printed capacitors which are three-dimensionally formed in printed circuit boards have been proposed.

FIGS. 1A and 1B show an example wherein a printed capacitor is formed in a two-layered circuit board 2. A conductive film (first electrode portion) 5 is formed on one surface 1a of a board 1, and a conductive film (second electrode portion) 4 is also formed on a rear surface 1b. These conductive films 5 and 4 are arranged to oppose each other to sandwich an insulating substrate 2, thereby forming a printed capacitor C. Note that reference numeral 6 in FIGS. 1A and 1B denotes a through-hole; and 7, a through-hole terminal for electrically connecting the through-hole 6 to the surface 1a of the board 1.

The prior art shown in FIGS. 1A and 1B exemplifies a two-layered board. Furthermore, in order to facilitate an assembling process of parts, and the like, and to achieve high-density packaging, a method of integrally forming a capacitor part in a multi-layered printed circuit board has also been proposed.

FIGS. 2 to 4 show a conventional printed capacitor formed in a multi-layered printed circuit board constituted by three or more layers. FIG. 2 is a plan view of the printed capacitor, FIG. 3 is a sectional view taken along a line XXVI—XXVI in FIG. 2, and FIG. 4 is an exploded perspective view of the printed capacitor in units of layers. More specifically, a multi-layered printed circuit board 1 is constituted by alternately stacking two or more insulating layers 2 (three layers in FIGS. 2 to 4), and three or more conductive layers 3 (four layers in FIGS. 2 to 4). A pair of electrode films 4 and 5, which oppose each other to sandwich one insulating layer 2 therebetween are respectively formed on the two conductive layers 3. The pair of electrode films 4 and 5 serve as electrodes of a capacitor. In the example shown in FIGS. 2 to 4, the electrode film 4 on the inner layer side of the multi-layered printed circuit board 1 is connected to the uppermost layer of the multi-layered printed circuit board 1 via a plated through-hole 6.

In the printed capacitor shown in FIG. 1, the capacitance of the capacitor is assured by the areas of the conductive films 5 and 4 formed on the surfaces 1a and 1b of the board. When a large-capacitance capacitor is to be realized, the area of the capacitor on the board becomes large, and a compact structure cannot be realized.

Similarly, in the printed capacitor of three or more layers shown in FIGS. 2 to 4, the electrode films 4 and 5 must be formed on wide ranges of the conductive layers 3 so as to assure a prescribed electrostatic capacitance. For this reason, the ratio of the areas of the electrode films 4 and 5 to the conductive layers 3 of the multi-layered printed circuit board 1 becomes large. As a result, the packing efficiency of parts cannot be improved very much.

SUMMARY OF THE INVENTION

It is, therefore, an object of the present invention to provide a printed circuit board which can be rendered compact independently of capacitance by arranging a pair of conductive members, which are electrically connected to each other via a conductive film, to oppose each other.

In order to achieve the above object, according to the present invention, there is provided a printed circuit board on which first and second electrode members are arranged to oppose each other, comprising:

a first conductor member which is electrically connected to said first electrode member and is formed to extend in a direction of thickness of said circuit board;

a second conductor member which is electrically connected to said second electrode member and is formed to extend in the direction of thickness of said circuit board; and a charge accumulation member which is formed between said first conductor member and said second conductor member, and has a predetermined dielectric constant, whereby said charge accumulation member serves as an embedded capacitor.

The charge accumulation member formed between the first and second conductor members serves as a capacitor.

It is another object of the present invention to provide a circuit board, which utilizes a through-hole as an electrode of a capacitor.

In order to achieve the above object, according a preferred aspect of the present invention, a first primary electrode line of the first electrode portion and a second primary electrode line of the second electrode portion extend on a primary surface of the circuit board, a first secondary electrode line of the first electrode portion and a second secondary electrode line of the second electrode portion extend on a secondary surface of the circuit board, the first conductor member for electrically connecting the first primary and secondary electrode lines is formed as through-holes at a plurality of positions on the first primary electrode line on the primary surface and the first secondary electrode line on the secondary surface, and the second conductor member for electrically connecting the second primary and secondary electrode lines is formed as through-holes at a plurality of positions on the second primary electrode line on the primary surface and the second secondary electrode line on the secondary surface.

It is still another object of the present invention to provide a printed circuit board which utilizes a portion of the circuit board as the charge accumulation member.

It is still another object of the present invention to provide a circuit board in which a high-density capacitor can be formed. In order to achieve the above objects, in a circuit board according to a preferred aspect of the present invention, the first and second electrode portions have an elongated shape, and a plurality of the first and second conductor members are formed at predetermined intervals along a longitudinal direction of the first and second electrode portions.

It is still another object of the present invention to provide a circuit board in which a high-density capacitor can be formed. In order to achieve the above object, in a circuit board according to a preferred aspect of the present invention, the first electrode portion has a substantially circular electrode, and a plurality of the first conductor members are formed along an outer perimeter of the circular electrode, and the second electrode portion has a substantially annular electrode which surrounds the first electrode portion, and a plurality of the second conductor members are formed along the annular pattern of the annular electrode.

It is still another object of the present invention to provide a circuit board in which a high-density capacitor can be formed. In order to achieve the above object, in a circuit board according to a preferred aspect of the present invention, a dielectric member extending in the direction of thickness of the circuit board is formed between an arbitrary one first conductor member formed on an electrode line of the first electrode portion, and one second conductor member, corresponding to the arbitrary one first conductor member, of the second conductor members formed on an electrode line of the second electrode portion.

It is still another object of the present invention to provide a circuit board in which a high-density capacitor can be formed. In order to achieve the above object, in a circuit board according to a preferred aspect of the present invention, the first electrode portion has a substantially circular electrode, and a plurality of the first conductor members are formed along an outer perimeter of the circular electrode, the second electrode portion has a substantially annular electrode which surrounds the first electrode portion, and a plurality of the second conductor members are formed along the annular pattern of the annular electrode, and a dielectric member extending in the direction of thickness of the circuit board is formed in an annular gap between the first and second electrode portions.

It is still another object of the present invention to provide a circuit board in which a high-density capacitor can be formed. In order to achieve the above object, in a circuit board according to a preferred aspect of the present invention, a dielectric member having a predetermined dielectric constant is formed in a direction of plane of the circuit board in a portion between an arbitrary one first conductor member formed on an electrode line of the first electrode portion, and one second conductor member, corresponding to the arbitrary one first conductor member, of the second conductor members formed on an electrode line of the second electrode portion, so that the dielectric member is sandwiched between portions of the circuit board.

It is still another object of the present invention to provide a circuit board in which a high-density capacitor can be formed. In order to achieve the above object, in a circuit board according to a preferred aspect of the present invention, the first electrode portion has an elongated shape, and the first conductor member is an elongated through-hole formed in the first electrode portion.

It is still another object of the present invention to provide a circuit board which incorporates a large-capacitance capacitor. In order to achieve the above object, in a circuit board according to a preferred aspect of the present invention, a dielectric constant of the dielectric member is higher than a dielectric constant of a material of the circuit board.

It is still another object of the present invention to provide a compact multi-layered circuit board which has a large capacitance. In order to achieve the above object, according to the present invention, there is provided a printed circuit board having:

at least two stacked insulating layers;

first and second electrode layers formed on arbitrary two layers of the outermost surface layers of said stacked insulating layers and an intermediate layer between said stacked insulating layers;

opposing first and second primary electrode portions formed on said first electrode layer, and opposing first and second secondary electrode portions formed on said second electrode layer, said circuit board comprising:

a plurality of first conductor members each of which electrically connects said first primary and secondary electrode portions, and are formed in a direction of thickness of said circuit board;

a plurality of second conductor members each of which electrically connects said second primary and secondary electrode portions, and are formed in the direction of thickness of said circuit board; and a charge accumulation member formed between at least one of said first conductor members and at least one of said second conductor members, and has a predetermined dielectric constant.

It is still another object of the present invention to provide a design method of a printed circuit board which allows easy adjustment of capacitance.

In order to achieve the above object, according to the present invention, there is provided a method of designing a printed circuit board having first and second electrode portions arranged to oppose each other, comprising the steps of:

forming a plurality of first conductor members, which are electrically connected to the first electrode portion, in a direction of thickness of the circuit board, while forming a plurality of second conductor members, which are electrically connected to the second electrode portion, in the direction of thickness of the circuit board;

forming a charge accumulation member, which has a predetermined dielectric constant, between at least one of the plurality of first conductor members and at least one of the plurality of second conductor members; and adjusting a capacitance formed between the first and second conductor members.

According to a preferred aspect of the present invention, the number of pairs of the first and second conductor members is adjusted.

According to another preferred aspect of the present invention, an interval between each two adjacent first and second conductor members is adjusted.

According to still another preferred aspect of the present invention, the number of pairs of the first and second conductor members is adjusted.

According to still another preferred aspect of the present invention, an interval between each two adjacent ones of the plurality of first conductor members and the plurality of second conductor members is adjusted.

According to still another preferred aspect of the present invention, sizes of the first and second conductor members are adjusted.

According to still another preferred aspect of the present invention, a change in material of the charge accumulation member is adjusted.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 25A is a plan view showing the arrangement of a printed capacitor according to the sixth embodiment of the present invention;

FIG. 25B is a bottom view showing the arrangement of the printed capacitor of the sixth embodiment;

FIG. 25C is a sectional view showing the arrangement, taken along a line F—F in FIG. 25A, of the printed capacitor of the sixth embodiment;

FIG. 33A is a plan view showing the arrangement of a printed capacitor according to the eighth embodiment of the present invention;

FIG. 33B is a bottom view showing the arrangement of the printed capacitor of the eighth embodiment;

FIG. 33C is a sectional view showing the arrangement, taken along a line H—H in FIG. 33A, of the printed capacitor of the eighth embodiment;

DETAILED DESCRIPTION OF THE PREFERRED EMBODIMENTS

Figure 1A:
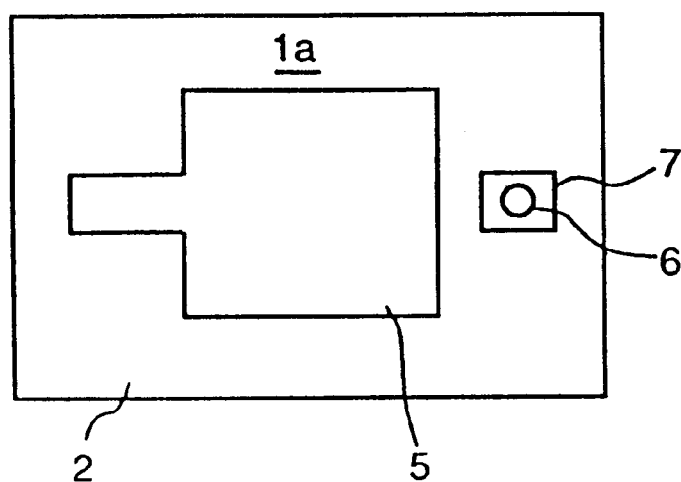
FIG. 1A is a plan view showing the arrangement of a conventional printed capacitor.
Figure 1B:
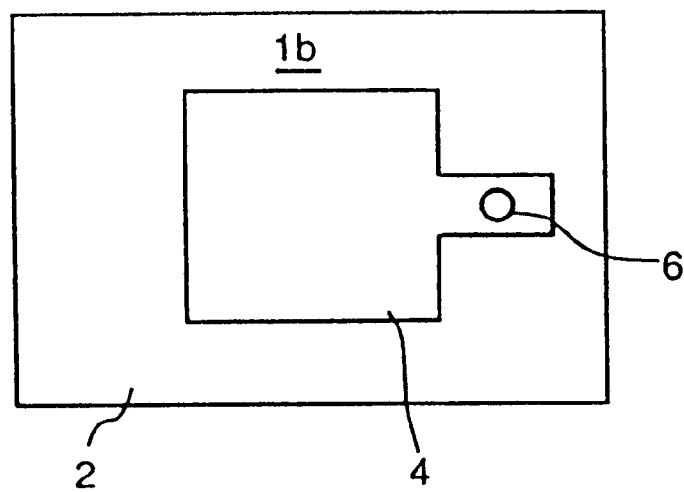
FIG. 1B is a bottom view showing the arrangement of the conventional printed capacitor.
Figure 2:
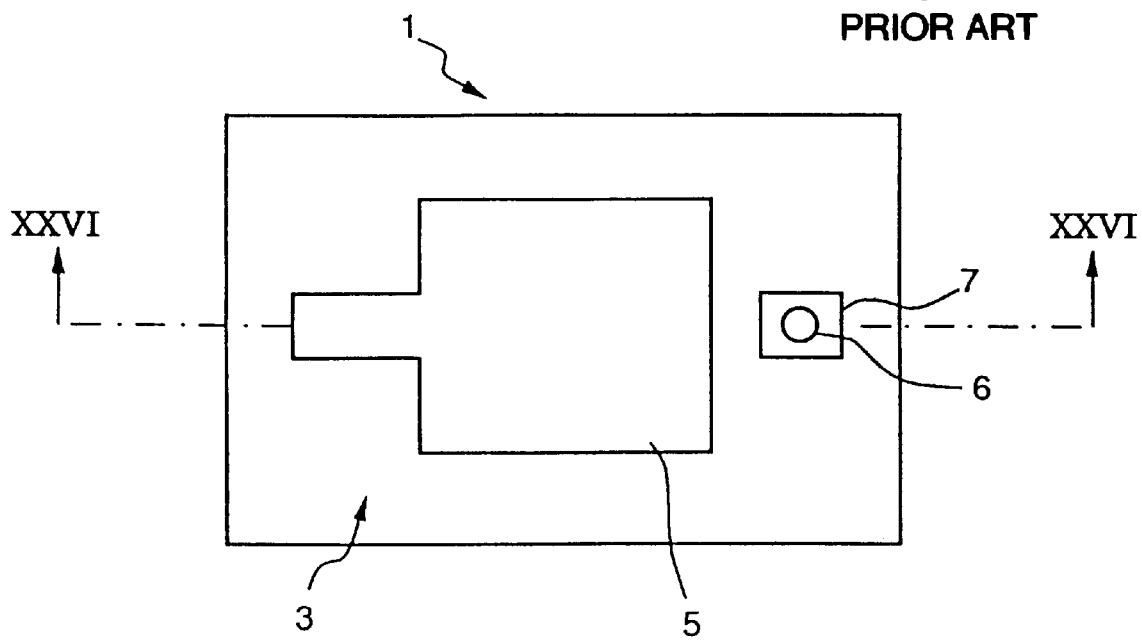
FIG. 2 is a plan view showing the arrangement of a printed capacitor in a conventional multi-layered circuit board.
Figure 3:
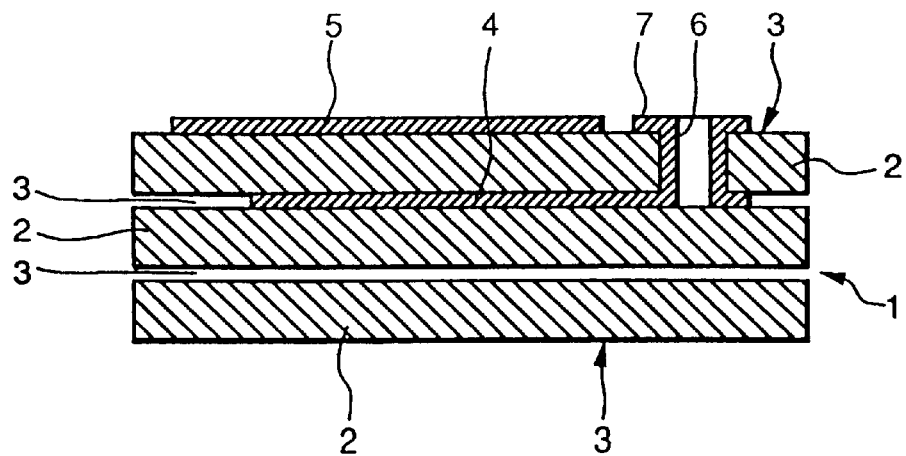
FIG. 3 is a sectional view showing the arrangement of the printed capacitor shown in FIG. 2.
Figure 4:
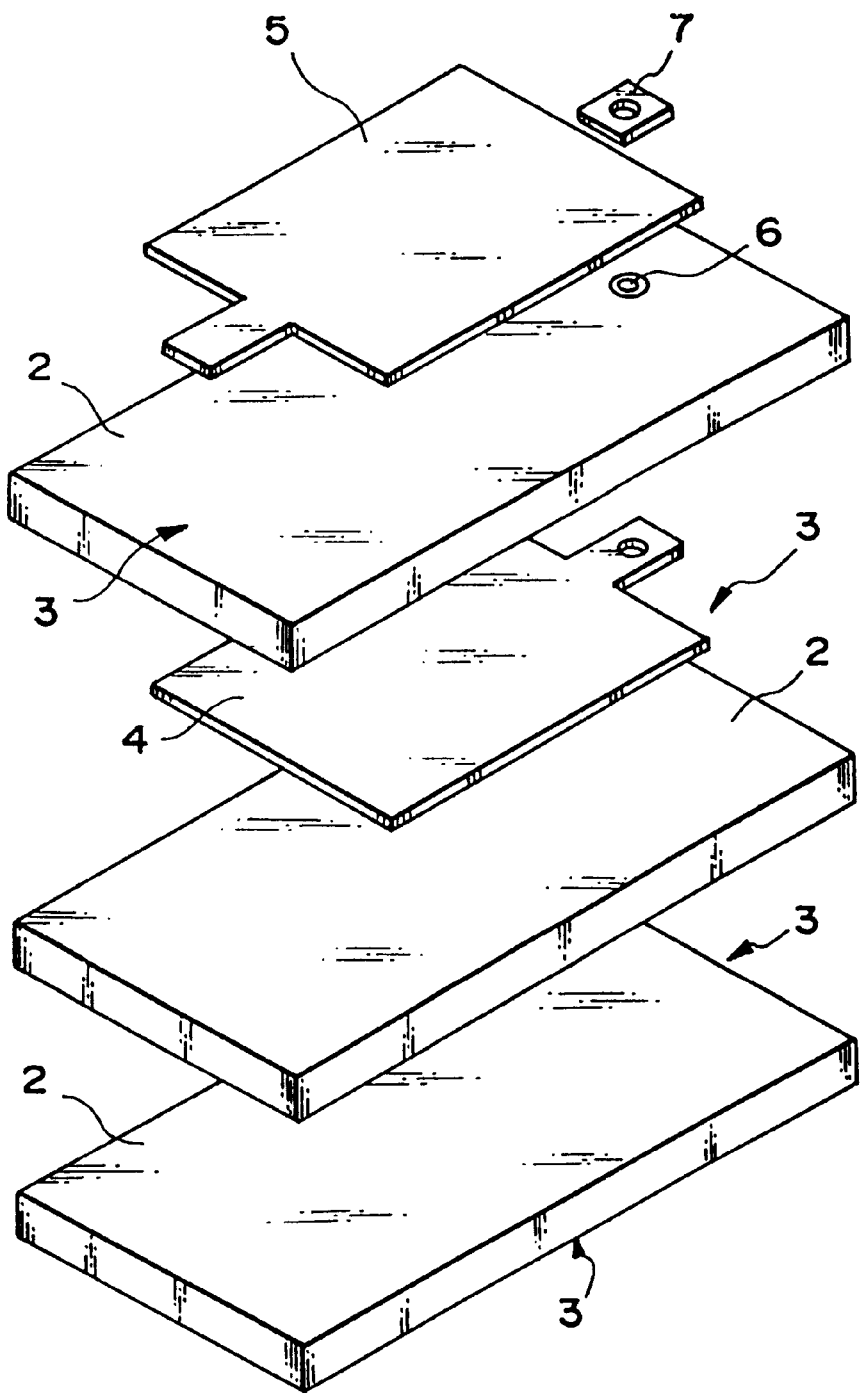
FIG. 4 is an exploded perspective view of the conventional printed capacitor shown in FIG. 2.

Preferred embodiments according to the present invention will be described hereinafter with reference to the accompanying drawings. Note that the same reference numerals denote the same parts throughout the embodiments, and a repetitive description thereof will be avoided. In each of the embodiments, a two-layered circuit board in which wiring layers are formed on the two surfaces of a single insulating substrate will be exemplified first, and a four-layered circuit board in which wiring layers are formed on the respective surfaces of three insulating substrates will be exemplified as a modification of the embodiment.

First Embodiment

The first embodiment of the present invention will be explained below with reference to FIGS. 5A to 5C.

Figure 5A:
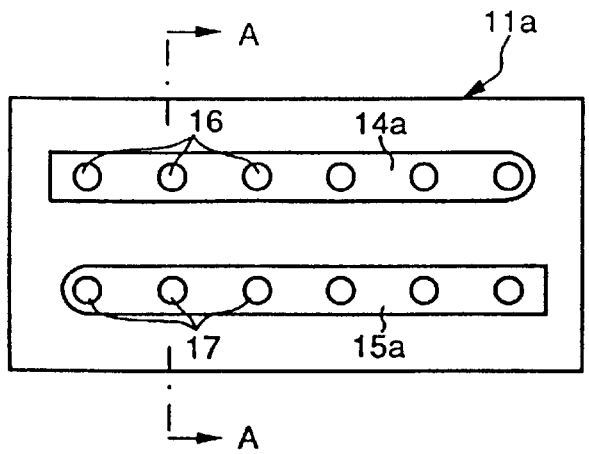
FIG. 5A is a plan view showing the arrangement of a printed capacitor according to the first embodiment of the present invention.
Figure 5B:
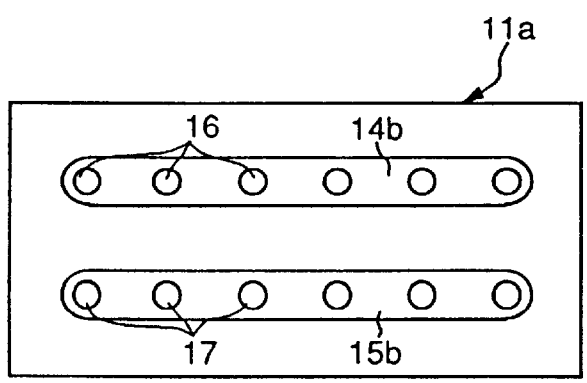
FIG. 5B is a bottom view showing the arrangement of the printed capacitor of the first embodiment.
Figure 5C:
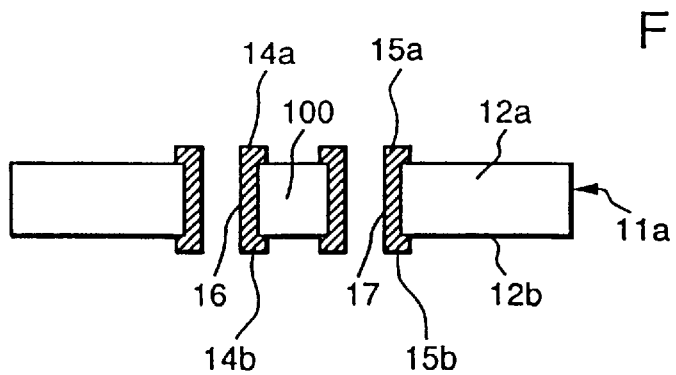
FIG. 5C is a sectional view showing the arrangement, taken along a line A—A in FIG. 5A, of the printed capacitor of the first embodiment.

Referring to FIGS. 5A to 5C, reference numeral 11a denotes an insulating substrate (or a high-resistance substrate or a semi-insulating substrate). In the substrate 11a, a printed capacitor is three-dimensionally formed.

The printed capacitor of the circuit board according to the first embodiment is formed between first and second electrode portions 14 and 15, which are arranged to oppose each other. The first electrode portion 14 comprises a linear conductive film 14a formed on a front surface 12a of the insulating substrate 11a, a conductive film 14b similarly formed on a rear surface 12b of the substrate 11a, and through-hole conductors 16 formed between the conductive films 14a and 14b. The conductive films 14a and 14b are electrically connected to each other via the through-hole conductors 16. The second electrode portion 15 comprises a linear conductive film 15a formed on the front surface 12a of the insulating substrate 11a, a conductive film 15b similarly formed on the rear surface 12b of the substrate 11a, and through-hole conductors 17 formed between the conductive films 15a and 15b. The conductive films 15a and 15b are electrically connected to each other via the through-hole conductors 17.

As shown in FIGS. 5A and 5B, arrays of a plurality of holes are formed on the conductive films 14a and 14b, and arrays of a plurality of holes are similarly formed on the conductive films 15a and 15b. The conductive film 14a on the front surface extends parallel to the conductive film 14b on the rear surface, and the interval between each two adjacent holes on the conductive film 14a matches the interval between each two adjacent holes on the conductive film 14b. Similarly, the conductive film 15a on the front surface extends parallel to the conductive film 15b on the rear surface, and the interval between each two adjacent holes on the conductive film 15a matches the interval between each two adjacent holes on the conductive film 15b. Therefore, the holes on the conductive film 14a are electrically connected to the holes on the conductive film 14b via the through-hole conductors 16. Also, the holes on the conductive film 15a are electrically connected to the holes on the conductive film 15b via the through-hole conductors 17.

Figure 5D:
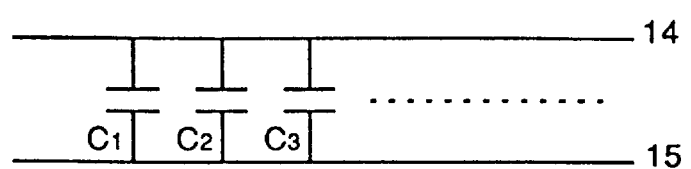
FIG. 5D is an equivalent circuit diagram of the printed capacitor of the first embodiment.

Therefore, as shown in FIG. 5C, a plurality of pairs of through-holes 16 and 17 are formed between the first and second electrode portions 14 and 15. Referring to FIG. 5C, a portion 100 of the substrate 11a is defined between each pair of through-hole conductors 16 and 17. Since the material of the substrate 11 has a predetermined dielectric constant, when a predetermined potential is supplied to the through-hole conductors 16 and 17, a charge is accumulated on the substrate portion 100. Therefore, each pair of through-hole conductors 16 and 17 and an associated substrate portion 100 form a single capacitor. As shown in FIG. 5D, a plurality of capacitors C1, C2, C3, . . . are formed parallel to each other between the first and second electrode portions 14 and 15.

According to the first embodiment, the capacitance of the capacitor formed by each pair of through-hole conductors 16 and 17 is determined by the interval between the through-hole conductors 16 and 17, the diameter of the through-hole, and the dielectric constant of the material of the substrate 11a. In other words, the total capacitance of the capacitors formed between the first and second electrode portions 14 and 15 can be adjusted by the number of through-holes, the diameter of each through-hole, and the interval between each two adjacent through-hole conductors. Especially, since a capacitor formed by a pair of through-holes is connected in parallel with a capacitor formed by other pairs of through-holes, the total capacitance of capacitors can be increased/decreased by increasing/decreasing the number of through-holes, thus allowing easy adjustment.

Upon formation a printed capacitor in a conventional circuit board, the capacitance of the capacitor is assured by the surface areas of two electrodes formed on the two surfaces of a substrate. Since it is difficult to change the thickness of the substrate, i.e., the inter-electrode distance, the surface areas of the electrodes must be changed to change the capacitance. Therefore, in order to obtain a large capacitance, electrodes with large surface areas must be formed on the substrate. On the other hand, in the printed circuit board of the first embodiment, since the capacitance of the printed capacitor is determined by the capacitance between two through-holes extending in the direction of thickness of the substrate, and by the number of pairs of through-holes, the following effects are provided:

Since electrodes with large surface areas need not be formed on the substrate, the degree of freedom on design in the printed circuit board can be improved, and this contributes to size and cost reductions of the circuit board.

The adjustment of capacitance can be easily attained by adjusting the number of through-holes, by adjusting the capacitance of each unit capacitor (e.g., by adjusting the through-hole interval or by changing the substrate material), and so on.

The capacitance of the printed capacitor can be very easily adjusted since it increases in proportion to the number of pairs of through-holes.

In the first embodiment, when a capacitor is formed by a pair of through-holes, which have a diameter of 0.5 mm, a through-hole length (substrate thickness) of 1.6 mm, and a distance of 2.0 mm between the pair of through-holes, the capacitor has a capacitance of about 2 pF when it is formed on a glass epoxy substrate (dielectric constant=4.8).

Multi-layered Arrangement of First Embodiment

The multi-layered arrangement of the circuit board of the first embodiment will be described below.

Figure 6:
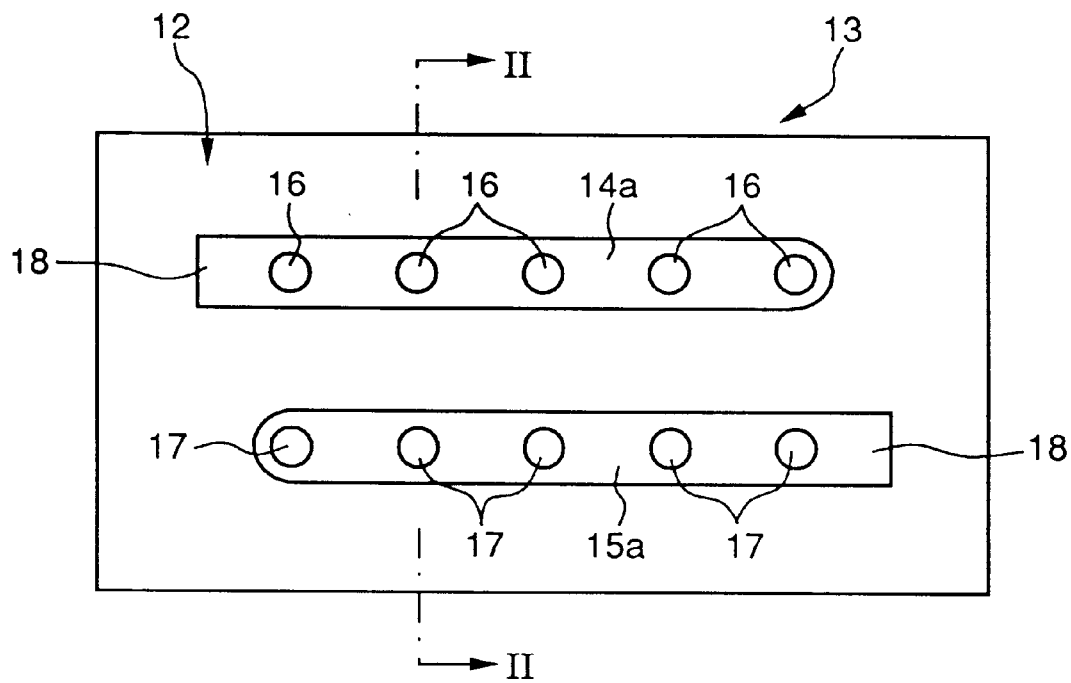
FIG. 6 is a plan view showing the arrangement of a printed capacitor according to a modification of the first embodiment.
Figure 7:
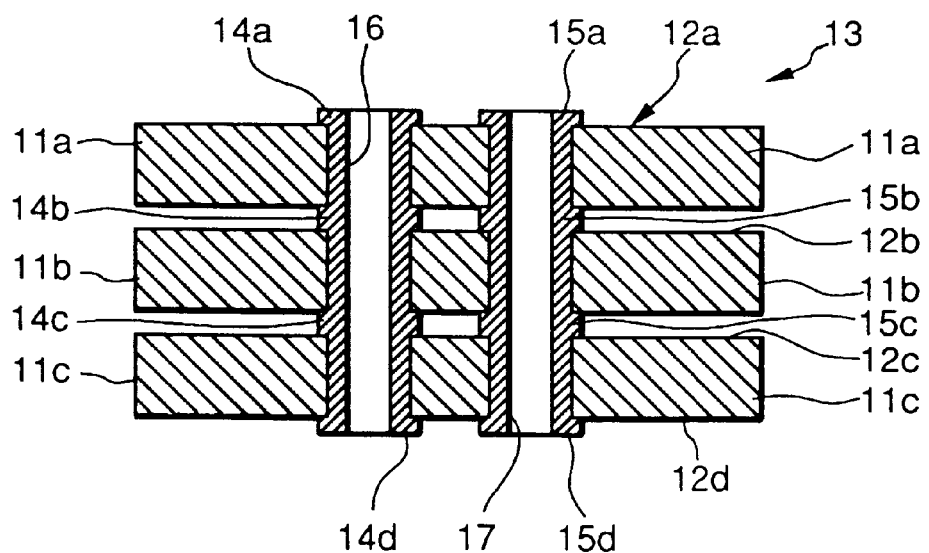
FIG. 7 is a sectional view showing the arrangement, taken along a line II—II in FIG. 6, of the printed capacitor according to the modification of the first embodiment.
Figure 8:
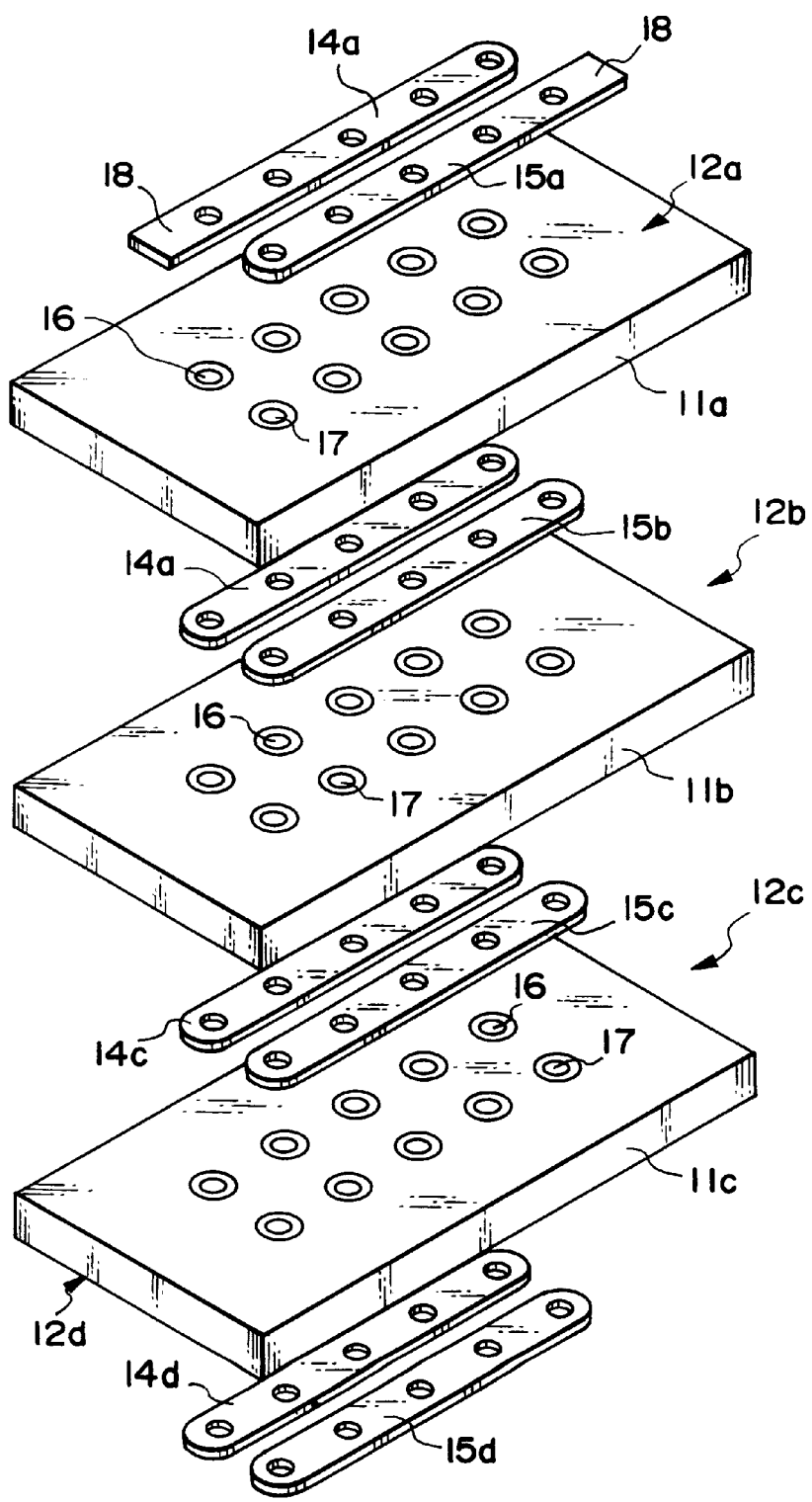
FIG. 8 is an exploded perspective view of the printed capacitor in units of layers according to the modification of the first embodiment.

FIG. 6 is a plan view of a multi-layered circuit board according to a modification of the first embodiment, FIG. 7 is a sectional view showing the structure, taken along a line II—II in FIG. 6, of the board according to the modification, and FIG. 8 is an exploded perspective view of the board according to the modification in units of layers.

A multi-layered printed circuit board 13 is constituted by alternately stacking three insulating layers 11a, 11b, and 11c, and four conductive layers 12a, 12b, 12c, and 12d. In this board 13, first conductive films 14 (14a, 14b, 14c, 14d) and second conductive films 15 (15a, 15b, 15c, 15d), which extend along the longitudinal direction (the right-and-left direction in FIG. 6) of the board 13, are formed in units of conductive layers 12 to be parallel to each other and in the vicinity of each other. The strip-shaped first and second conductive films 14 and 15 are respectively connected to first plated through-holes 16 and second plated through-holes 17 which are arranged at predetermined intervals and extend through the insulating layers 11 of the multi-layered printed circuit board 13.

Electrical connection portions 18, which are connected to a power source (not shown) via, e.g., soldering, are formed on the end portions of the first and second conductive films 14 and 15 formed on the uppermost layer of the multi-layered printed circuit board 13. The insulating layers 11 (11a, 11b, 11c) consist of a high-electrical resistance material in addition to an insulating or semi-insulating material. Other electrical circuits, electronic parts, and the like are formed or mounted on portions of the conductive layers 12 (12a, 12b, 12c, 12d), where the first and second conductive films 14 (14a, 14b, 14c, 14d) and 15 (15a, 15b, 15c, 15d) are not formed.

Therefore, a printed capacitor with a predetermined electrostatic capacitance can be formed in the multi-layered printed circuit board 13 by appropriately selecting the opposing interval between the first and second conductive films 14 and 15, the diameter of the first and second plated through-holes 16 and 17, the number of through-holes, the interval between each two adjacent through-holes, and the like in addition to the dielectric constant of the insulating layers 11.

In the first embodiment described above, the dielectric constant of a portion of each insulating layer 11 located between the plated through-holes 16 and 17 is set to be equal to that of other portions of each insulating layer 11, but may be changed as needed.

Second Embodiment

The second embodiment of the present invention will be described below with reference to FIGS. 9A to 9C.

Figure 9A:
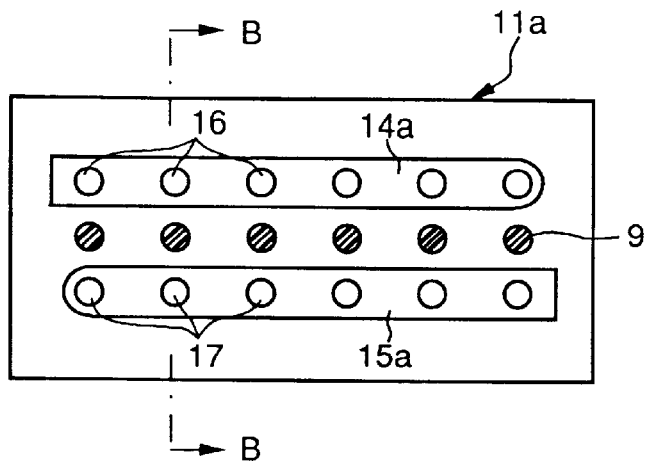
FIG. 9A is a plan view showing the arrangement of a printed capacitor according to the second embodiment of the present invention.
Figure 9B:
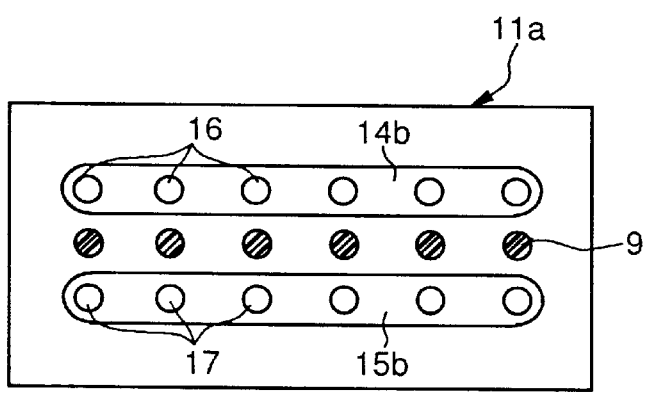
FIG. 9B is a bottom view showing the arrangement of the printed capacitor of the second embodiment.

A capacitor C2 of the second embodiment is substantially the same as that in the first embodiment, except that a compound dielectric material 9 is buried between each two adjacent through-hole conductors 16 and 17, as shown in FIG. 9A. More specifically, in the second embodiment, the dielectric constant between each two adjacent through-holes is set to be different from (normally, larger than) that of the substrate material.

Figure 9C:
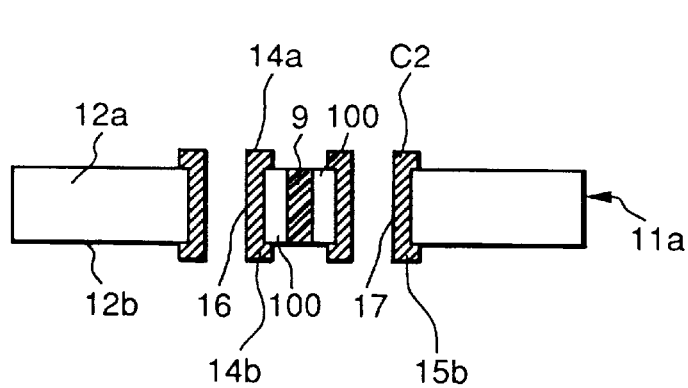
FIG. 9C is a sectional view showing the arrangement, taken along a line B—B in FIG. 9A, of the printed capacitor of the second embodiment.

FIG. 9C is a sectional view showing the arrangement, taken along a line B—B in FIG. 9A, of the board of the second embodiment. As shown in FIG. 9C, portions 100 consisting of the same material as the substrate material and a portion 9 buried with a dielectric material are formed between a pair of through-holes 16 and 17. The composite dielectric material is not particularly limited as long as it is an insulating material such as ceramics, mica, or the like having a higher dielectric constant than that of the substrate 11.

Figure 9D:
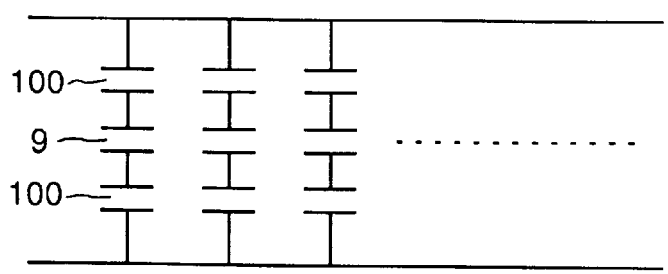
FIG. 9D is an equivalent circuit diagram of the printed capacitor of the second embodiment.

FIG. 9D shows an equivalent circuit of the printed capacitor formed in the board of the second embodiment. More specifically, two capacitors formed by the portions 100 of the substrate and a capacitor formed by a hole 9 are connected in series with each other between a pair of through-holes.

According to the second embodiment, the capacitance of the capacitor can be easily adjusted by appropriately selecting the material of the compound dielectric material 9 in addition to the same effect as in the first embodiment described above.

In order to bury the dielectric material 9 between the through-holes, a dielectric material powder is prepared, and is mixed in a thermosetting resin adhesive paste. The paste is printed and buried in through-holes 9 formed between the through-holes, or is injected into the through-holes 9 formed between the through-holes using, e.g., a dispenser. In this manner, after the compound material is injected into the through-holes 9, the injected material is set hard by heat.

Modification of Second Embodiment

Figure 10:
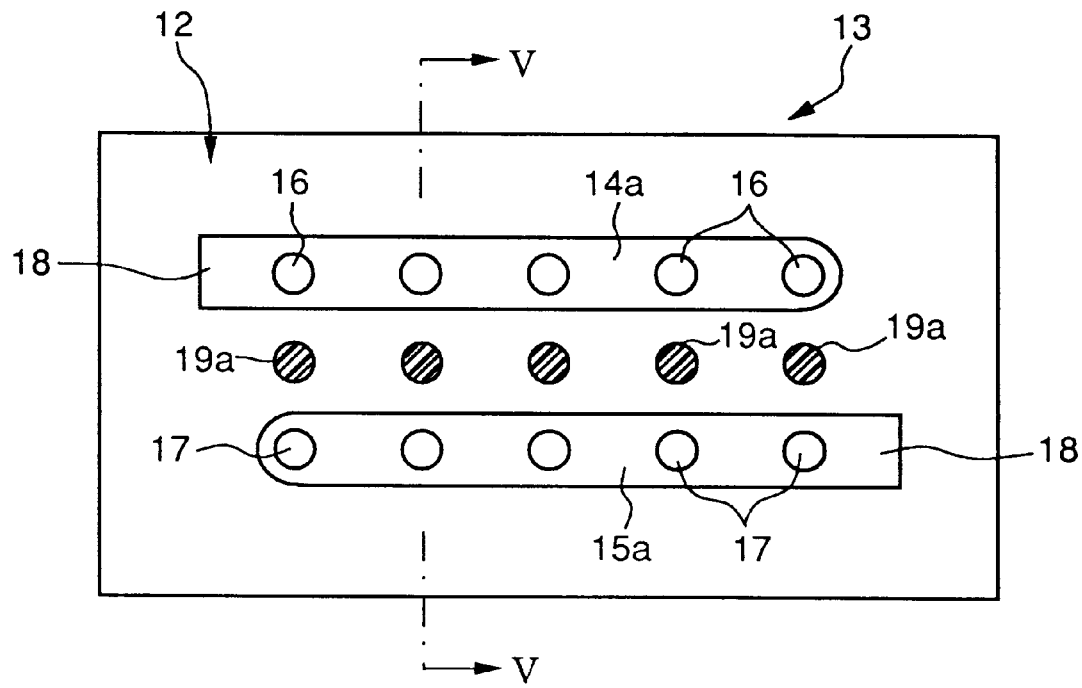
FIG. 10 is a plan view showing the arrangement of a printed capacitor according to a modification of the second embodiment.
Figure 11:
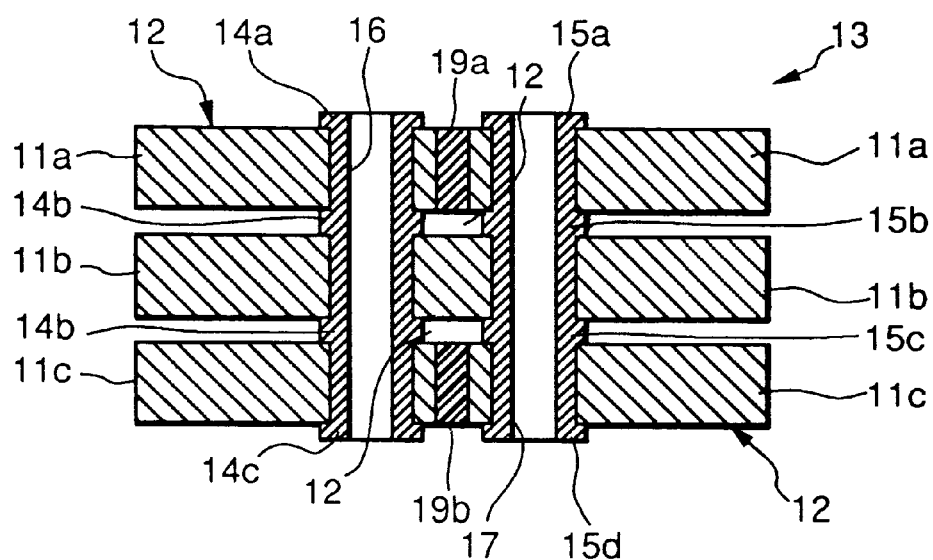
FIG. 11 is a sectional view showing the arrangement, taken along a line V—V in FIG. 10, of the printed capacitor according to the modification of the second embodiment.
Figure 12:
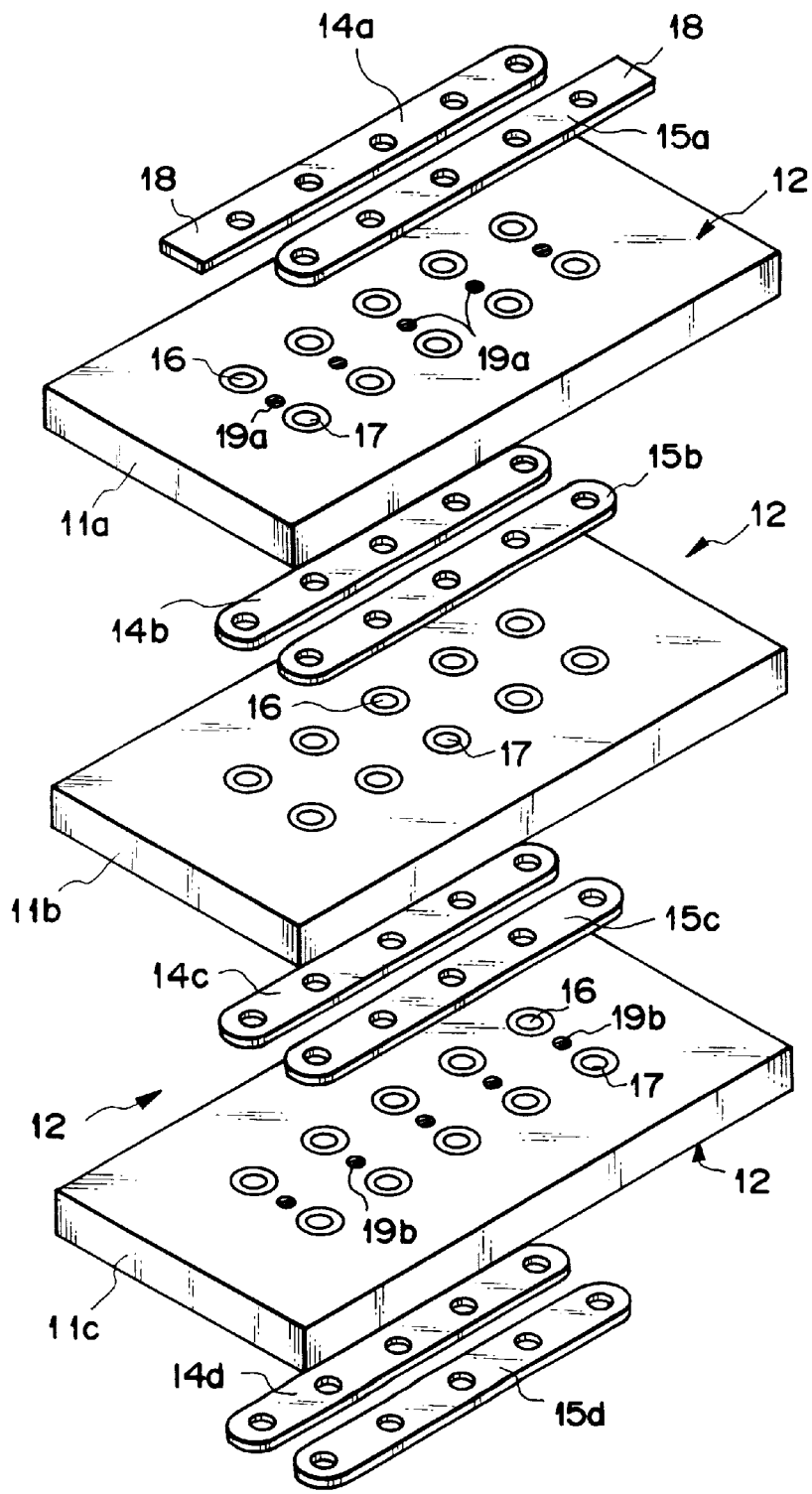
FIG. 12 is an exploded perspective view of the printed capacitor in units of layers according to the modification of the second embodiment.

FIG. 10 is a plan view showing a circuit board according to a modification of the second embodiment, FIG. 11 is a sectional view taken along a line V—V of FIG. 10, and FIG. 12 is an exploded perspective view of the board in units of layers.

More specifically, columnar hole-shaped insulating portions 19, each of which is located at an intermediate position between a pair of opposing plated through-holes 16 and 17, and in each of which a material having a dielectric constant different from that of the surrounding insulating layer 11 (11a or 11c) is injected, are integrally buried in two insulating layers (uppermost and lowermost insulating layers 11a and 11c in FIG. 11) on the two surface sides of the multi-layered printed circuit board 13.

As a method of forming the hole-shaped insulating portions 19 in the insulating layers 11 (11a and 11c), holes are formed at predetermined positions on the insulating layers 11 (11a and 11c) by a drill or a laser beam, and a material having a different dielectric constant is filled in the holes by screen printing or dispenser injection.

According to the modification of the second embodiment, a printed capacitor with a predetermined electrostatic capacitance can be formed in the multi-layered printed circuit board 13 more easily than in the first embodiment by changing the material of the insulating layers 11 and the material (dielectric constant) of the insulating portions 19, by changing the interval between the first and second conductive films 14 (14a, 14b, 14c, 14d) and 15 (15a, 15b, 15c, 15d), by changing the diameters of the first and second plated through-holes 16 and 17, and by appropriately selecting the number of through-holes and the interval between each two adjacent through-holes.

In the second embodiment, the insulating portions 19 with a different dielectric constant are not formed in the intermediate insulating layer (the insulating layer 11b in FIG. 11). Alternatively, the insulating portions 19 may be similarly buried in this insulating layer as in the two insulating layers (11a and 11c) on the two surface sides of the board.

Third Embodiment

In the second embodiment of the present invention shown in FIGS. 9A to 12, the columnar insulating portions 19 which are parallel to the plated through-holes 16 and 17 and have a different dielectric constant are buried in the insulating layers 11 (11a, 11b, 11c) present between the opposing first and second plated through-holes 16 and 17. Alternatively, each of the insulating layers 11 (11a, 11b, 11c) may be formed by a plurality of dielectric layers having different dielectric constants. The third embodiment relates to this modification.

The third embodiment of the present invention will be described below with reference to FIGS. 13A to 13C.

Figure 13A:
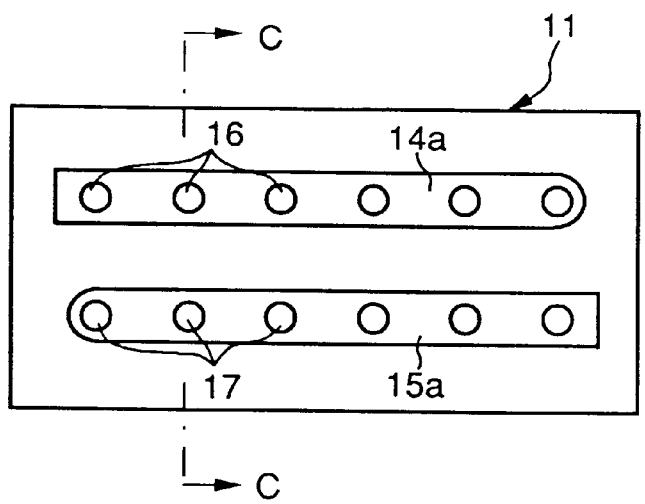
FIG. 13A is a plan view showing the arrangement of a printed capacitor according to the third embodiment of the present invention.
Figure 13B:
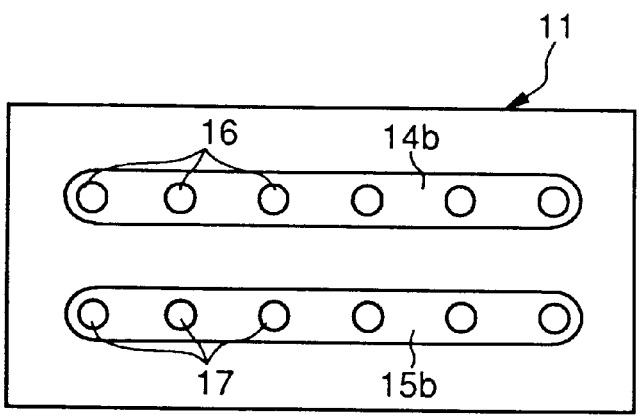
FIG. 13B is a bottom view showing the arrangement of the printed capacitor of the third embodiment.
Figure 13C:
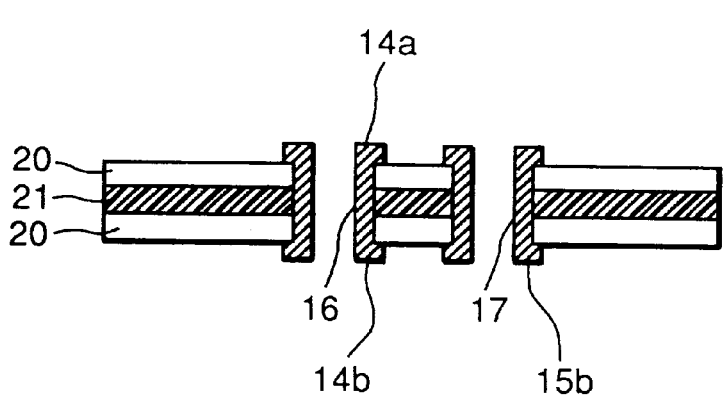
FIG. 13C is a sectional view showing the arrangement, taken along a line C—C in FIG. 13A, of the printed capacitor of the third embodiment.

In the third embodiment, as shown in FIGS. 13A to 13C, a substrate 11 is constituted by stacking high-resistance substrate layers 20 and a compound dielectric material layer 21. Therefore, the compound dielectric material is arranged between the through-hole conductors 16 and 17, as in the second embodiment.

According to the circuit board of the third embodiment, the capacitance of the printed capacitor formed in the board can be adjusted by the number and diameter of through-hole conductors 16 and 17, the interval between each two adjacent through-hole conductors, or the material of the compound dielectric material layer 21. Therefore, even when a large-capacitance capacitor is to be formed, predetermined surface areas of the conductive films 14 and 15 need not be assured unlike in the prior art, and the printed capacitor can be rendered compact.

Modification of Third Embodiment

Figure 14:
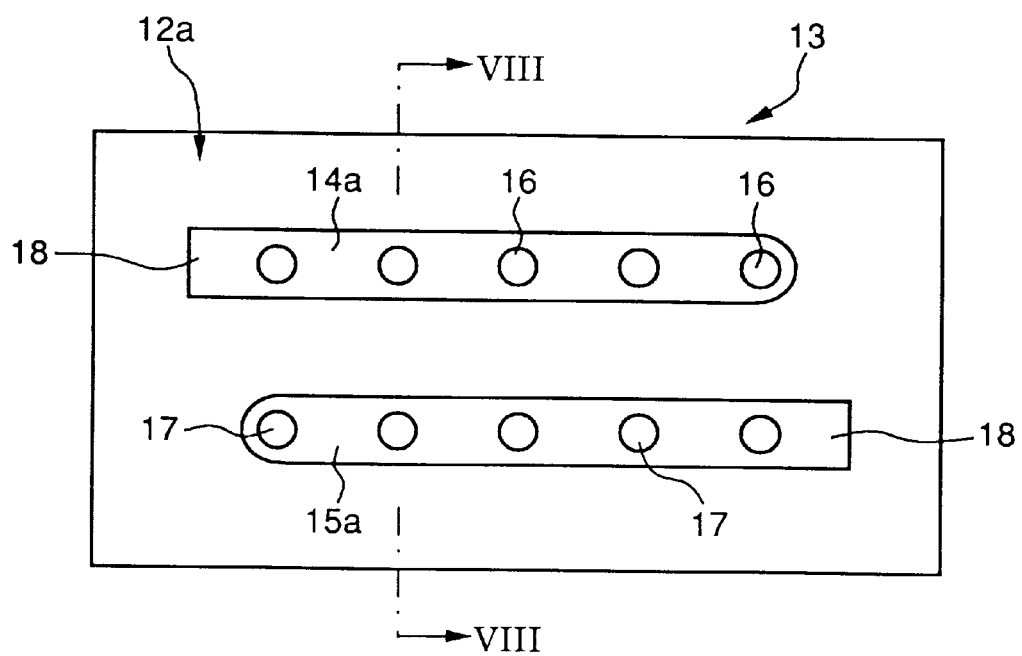
FIG. 14 is a plan view showing the arrangement of a printed capacitor according to a modification of the third embodiment.
Figure 15:
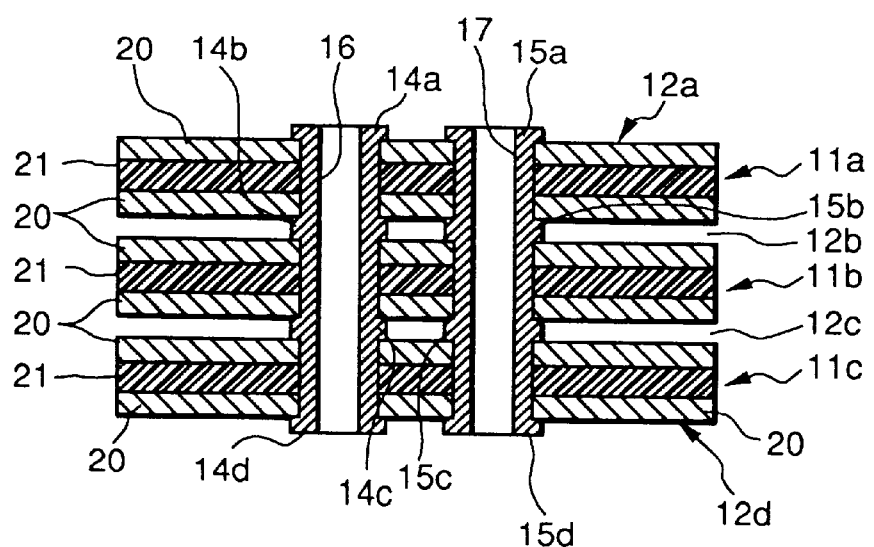
FIG. 15 is a sectional view showing the arrangement, taken along a line VIII—VIII in FIG. 14, of the printed capacitor according to the modification of the third embodiment.
Figure 16A:
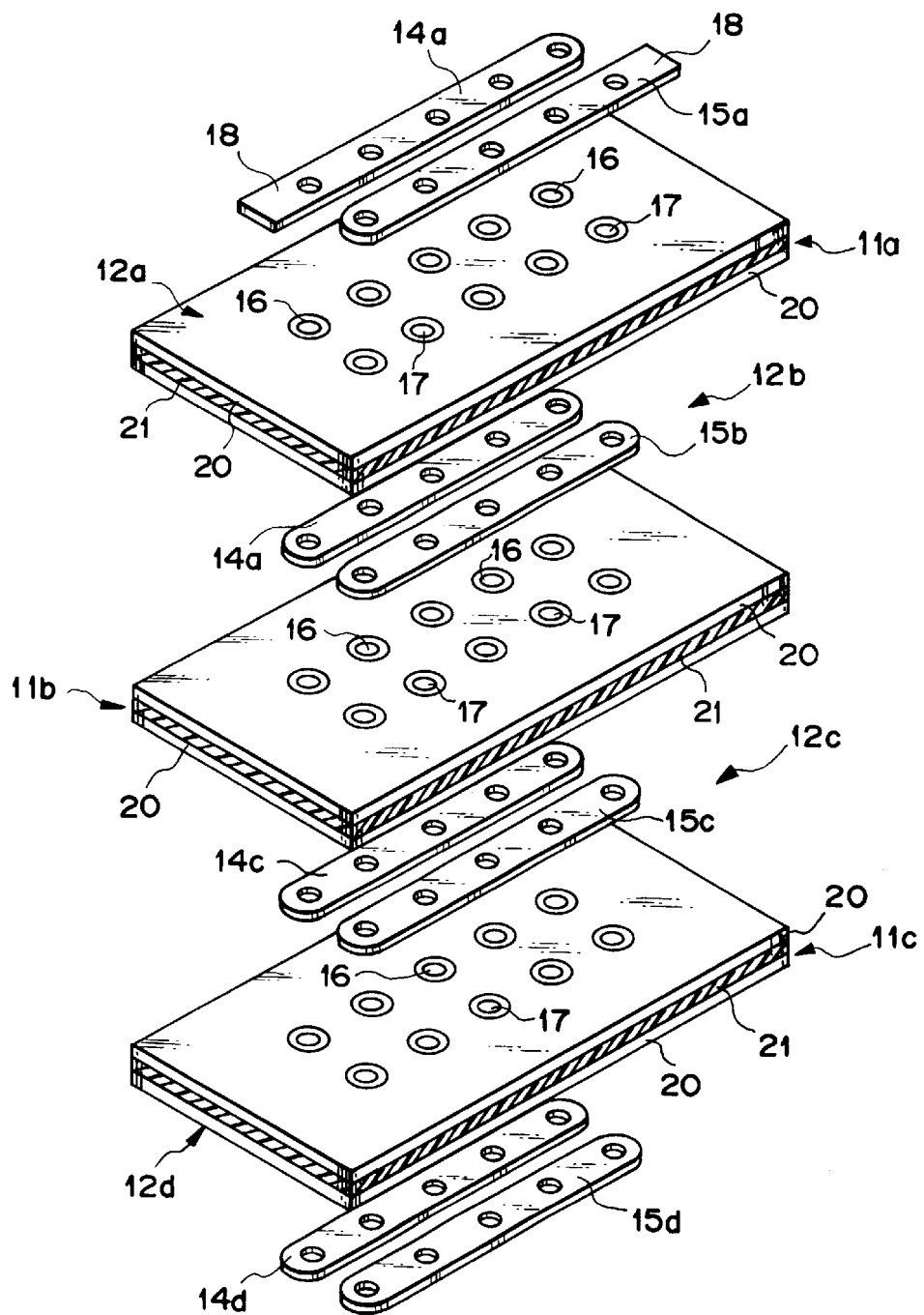
FIG. 16A is an exploded perspective view of the printed capacitor in units of layers according to the modification of the third embodiment.

FIG. 14 is a plan view of a circuit board according to a modification of the third embodiment, FIG. 15 is a sectional view taken along a line VIII—VIII in FIG. 14, and FIG. 16A is an exploded perspective view of the board in units of layers. More specifically, each of the insulating layers 11 (11a, 11b, 11c) is constituted by alternately stacking different types of dielectric layers (two different types of layers in FIG. 15) 20 and 21 in three layers. With this structure, since the dielectric constant of the insulating layer 11 (11a, 11b, 11c) present between the opposing first and second plated through-holes 16 and 17 can be set to be different from that in the first embodiment, the printed capacitor with a predetermined electrostatic capacitance can be formed on the multi-layered printed circuit board 13 more easily than in the printed capacitor of the first embodiment.

Figure 16B:
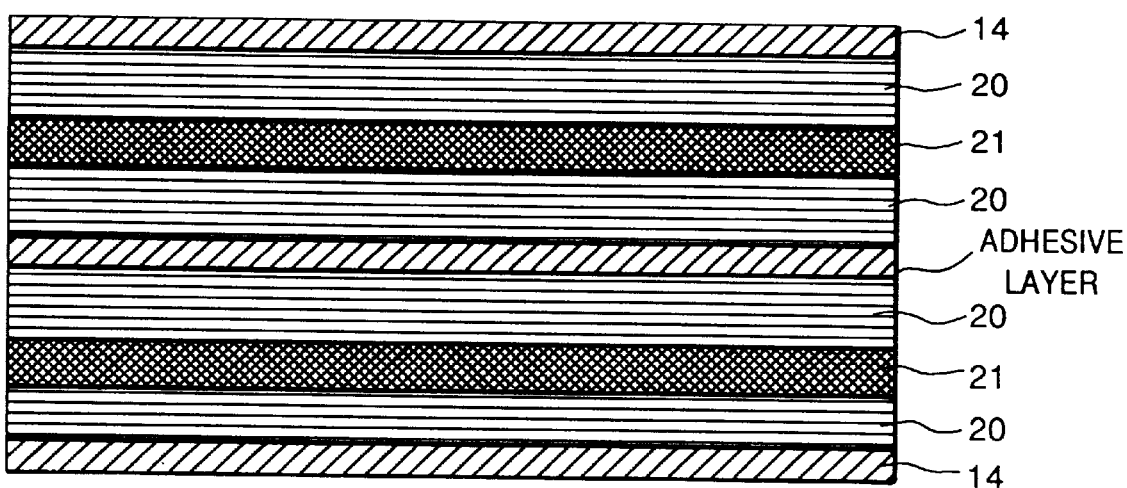
FIG. 16B is a view for explaining a method of manufacturing a circuit board of the third embodiment.

A method of manufacturing a printed circuit board in which a dielectric member is sandwiched will be described below with reference to FIG. 16B. As shown in FIG. 16B, multi-layered substrates, each consisting of an electrode layer 14 (15), an insulating substrate layer 20, a compound dielectric material layer 21, and an insulating substrate layer 20, are formed, and are adhered to each other via an adhesive layer. An adhesive on the adhesive layer is hardened by thermal compression. Note that the substrate layer 20 consists of a planar compound material as a combination of a base material of a layered structure such as paper, cloth, glass cloth, or the like, and a resin such as a phenolic resin, epoxy resin, or the like. The compound dielectric material layer consists of a planar compound material combined with a phenolic resin, epoxy resin, or the like in which a powder of mica, ceramics, or the like with a higher dielectric constant than that of the substrate layer 20 is mixed.

Since the compound dielectric material having a higher dielectric constant than that of a glass epoxy substrate 20 is inserted between a pair of through-holes, a larger capacitance value can be obtained. When a compound dielectric material having a dielectric constant twice that of the glass epoxy substrate is inserted, the capacitance value can be almost doubled.

Fourth Embodiment

In each of the first to third embodiments described above, the strip-shaped conductive films 14 (14a, 14b, 14c, 14d) and 15 (15a, 15b, 15c, 15d) are linearly arranged along the longitudinal direction of the multi-layered printed circuit board 13 to be parallel to each other. However, these conductive films may be formed in other patterns in correspondence with a printed circuit pattern formed on each conductive layer 12. In the fourth embodiment, the present invention is applied to other patterns.

The fourth embodiment of the present invention will be described below with reference to FIGS. 17A to 17C.

Figure 17A:
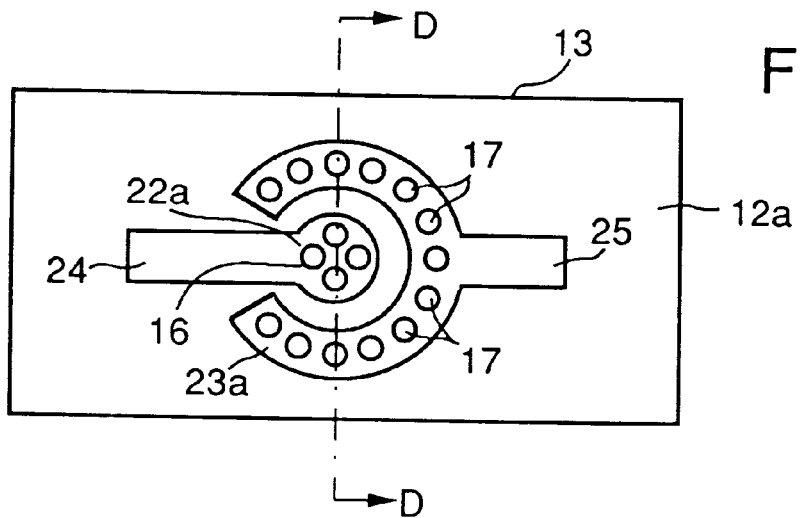
FIG. 17A is a plan view showing the arrangement of a printed capacitor according to the fourth embodiment of the present invention.

As shown in FIG. 17A, a first electrode portion 22 and a second electrode portion 23 arranged to surround the first electrode portion 22 are formed on the front surface 12a of the printed circuit board 13 according to the fourth embodiment. The first electrode portion 22 has a terminal 24 and a conductive film 22a, and the second electrode portion 23 has a terminal 25 and a conductive film 23a. A plurality of through-holes 16 are formed on the conductive film 22a. Also, a plurality of through-holes 17 are formed on the conductive film 23a in an annular pattern.

Figure 17B:
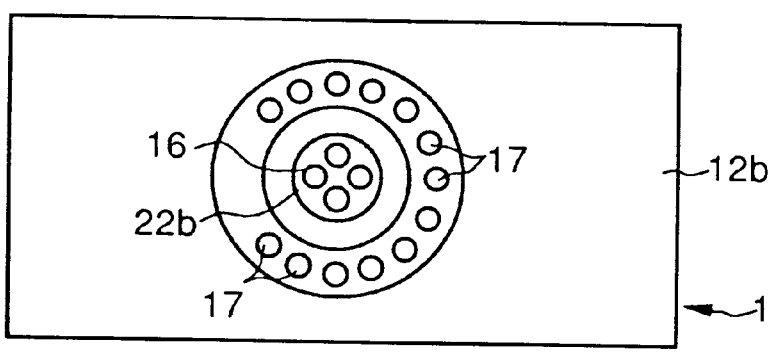
FIG. 17B is a bottom view showing the arrangement of the printed capacitor of the fourth embodiment.

In FIG. 17B, a circular conductive film 22b and an annular conductive film 23b are formed on the rear surface 12b of the substrate 11. The plurality of holes 16 formed on the conductive film 22a on the front surface 12a are respectively arranged at positions which coincide with those of a plurality of holes 16 formed on the conductive film 22b on the rear surface 12b. Therefore, as shown in FIG. 17C, the conductive films 22a and 22b are electrically connected to each other via through-hole conductors 16. Similarly, the plurality of holes 17 formed on the conductive film 23a on the surface 12a are arranged at positions which coincide with a plurality of holes 17 formed on the conductive film 23b on the rear surface 12b. Therefore, as shown in FIG. 17C, the conductive films 23a and 23b are electrically connected to each other via through-hole conductors 17.

Figure 17C:
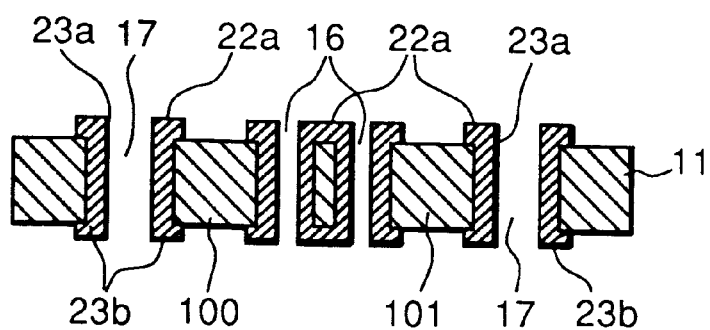
FIG. 17C is a sectional view showing the arrangement, taken along a line D—D in FIG. 17A, of the printed capacitor of the fourth embodiment.

With this arrangement, on, e.g., a line D—D in FIG. 17A, two substrate portions (100, 101) each of which is sandwiched between a pair of through-hole conductors are present, and capacitors are formed in these substrate portions (100, 101) when charges are accumulated in these two substrate portions (100, 101), as shown in FIG. 17C.

The capacitance of the printed capacitor of the fourth embodiment can be adjusted by the number and diameter of through-hole conductors 16 and 17, or the interval between each two adjacent through-hole conductors. Therefore, even when a large-capacitance capacitor is to be formed, predetermined surface areas of the conductive films need not be assured unlike in the prior art, and the printed capacitor can be rendered compact.

Modification of Fourth Embodiment

A modification associated with the multi-layered arrangement of the fourth embodiment will be described below.

Figure 18:
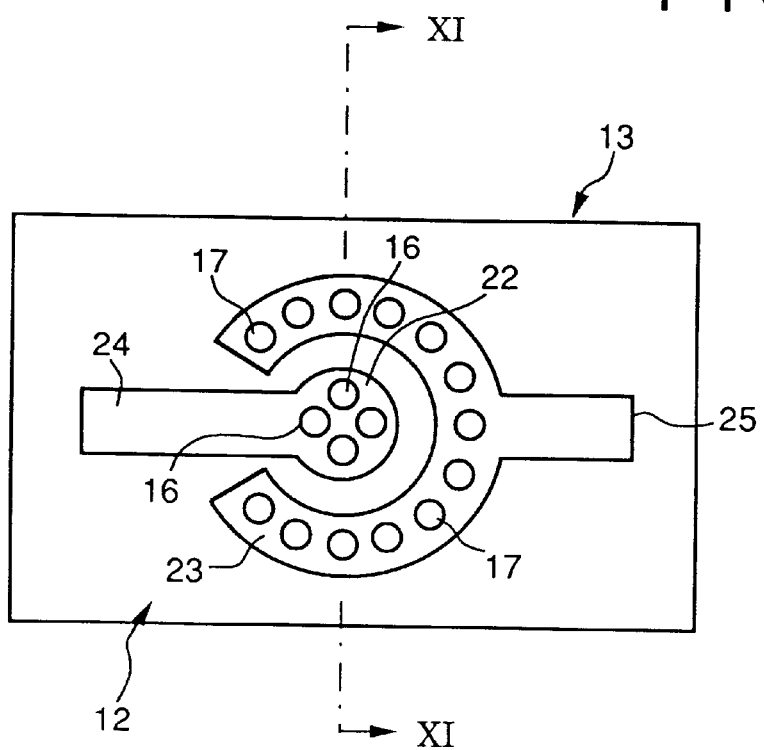
FIG. 18 is a plan view showing the arrangement of a printed capacitor according to a modification of the fourth embodiment.
Figure 19:
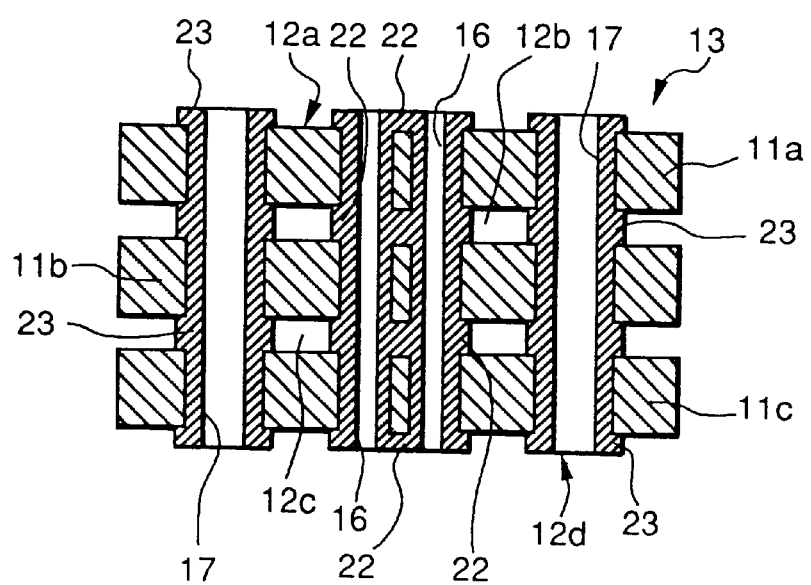
FIG. 19 is a sectional view showing the arrangement, taken along a line XI—XI in FIG. 18, of the printed capacitor according to the modification of the fourth embodiment.
Figure 20:
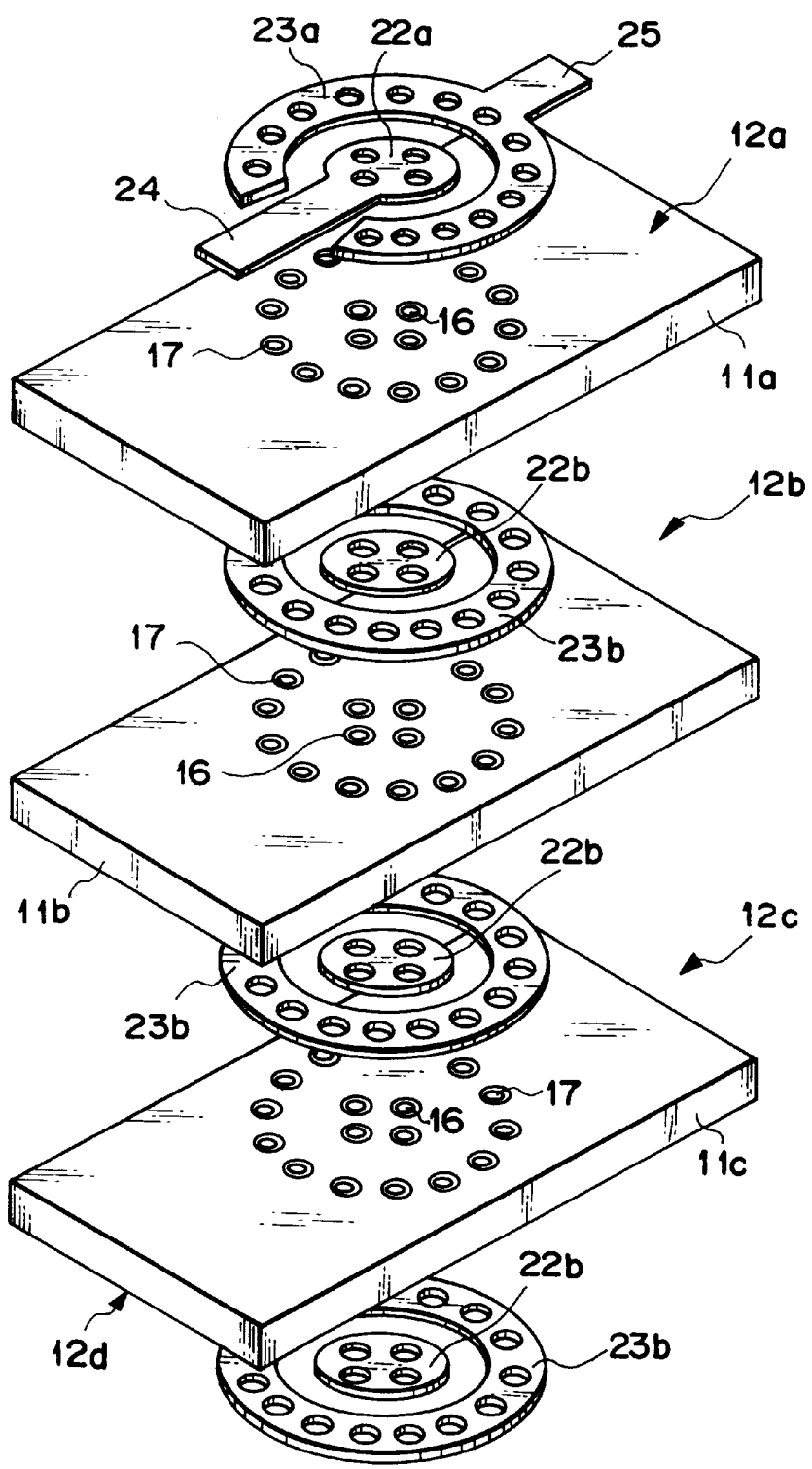
FIG. 20 is an exploded perspective view of the printed capacitor in units of layers according to the modification of the four th embodiment.

FIG. 18 is a plan view of a circuit board according to this modification, FIG. 19 is a sectional view taken along a line XI—XI in FIG. 18, and FIG. 20 is an exploded perspective view of the board in units of layers.

More specifically, circular first conductive films 22 (22a, 22b) and annular second conductive films 23 (23a, 23b) which surround the first conductive films 22 are concentrically formed on the central portions of conductive layers 12 (12a, 12b, 12c, 12d) of the multi-layered printed circuit board 13. Since an electrical connection portion 24, which is connected to a power source (not shown) via, e.g., soldering, extends, in the longitudinal direction of the multi-layered printed circuit board 13, from the first conductive film 22 formed on the uppermost layer of the multi-layered printed circuit board 13, the second conductive film 23 which surrounds the first conductive film 22 is notched in a horseshoe shape, and an electrical connection portion 25, which is connected to a power source (not shown) via, e.g., soldering, also extends from the second conductive film 23 in a direction opposite to the electrical connection portion 24. The first and second conductive films 22 and 23 are respectively connected to the first and second plated through-holes 16 and 17 which are arranged at predetermined angular intervals along the circumferential directions of the conductive films, and extend through the insulating layers 11 (11a, 11b, 11c) of the multi-layered printed circuit board 13.

The insulating layers 11 (11a, 11b, 11c) consist of a high-electrical resistance material in addition to an insulating or semi-insulating material. Other electrical circuits, electronic parts, and the like are formed or mounted on portions of the conductive layers 12, where the first and second conductive films 22 and 23 are not formed.

Therefore, a printed capacitor with a predetermined electrostatic capacitance can be formed in the multi-layered printed circuit board 13 by appropriately selecting the interval between the opposing first and second conductive films 22 and 23, the diameter and number of the first and second plated through-holes 16 and 17, the interval between each two adjacent through-holes, and the like, in addition to the dielectric constant of the insulating layers 11 (11a, 11b, 11c).

The printed capacitor of the fourth embodiment utilizes concentric electrodes. Therefore, the occupied area on the substrate can be reduced as compared to the first embodiment, when the capacitance of the printed capacitor remains the same.

Fifth Embodiment

Figure 21A:
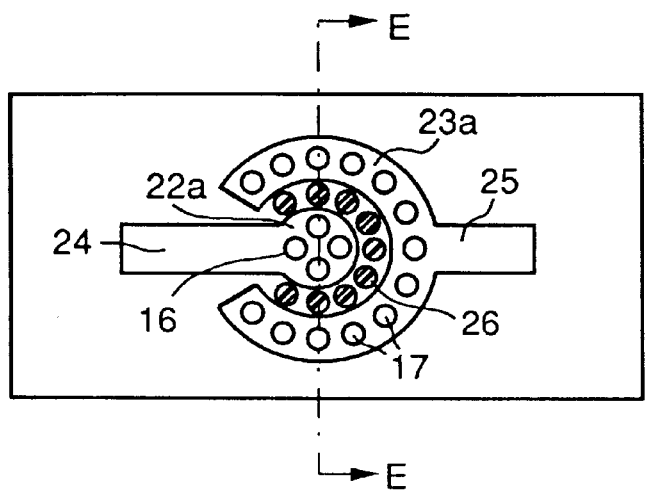
FIG. 21A is a plan view showing the arrangement of a printed capacitor according to the fifth embodiment of the present invention.
Figure 21B:
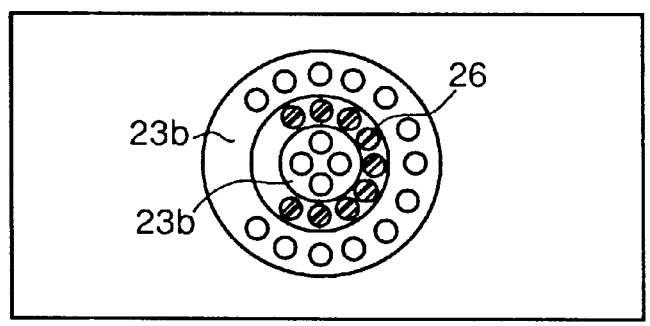
FIG. 21B is a bottom view showing the arrangement of the printed capacitor of the fifth embodiment.
Figure 21C:
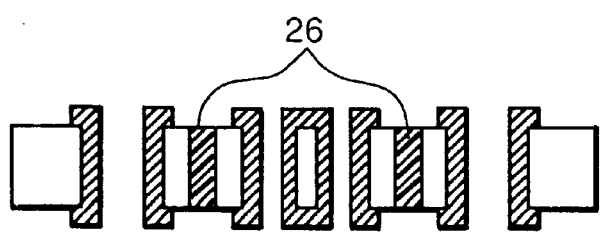
FIG. 21C is a sectional view showing the arrangement, taken along a line E—E in FIG. 21A, of the printed capacitor of the fifth embodiment.

The fifth embodiment of the present invention will be described below with reference to FIGS. 21A to 21C.

In the printed capacitor according to the fifth embodiment, compound dielectric material portions 26 are buried between the through-hole conductors 16 and 17.

According to the fifth embodiment, the capacitance of the printed capacitor can be adjusted by the number and diameters of the through-hole conductors 16 and 17, the interval between each two adjacent through-hole conductors, or the material of the compound dielectric material portions 26. Therefore, even when a large-capacitance capacitor is to be formed, predetermined surface areas of the conductive films need not be assured unlike in the prior art, and the printed capacitor can be rendered compact.

Modification of Fifth Embodiment

Figure 22:
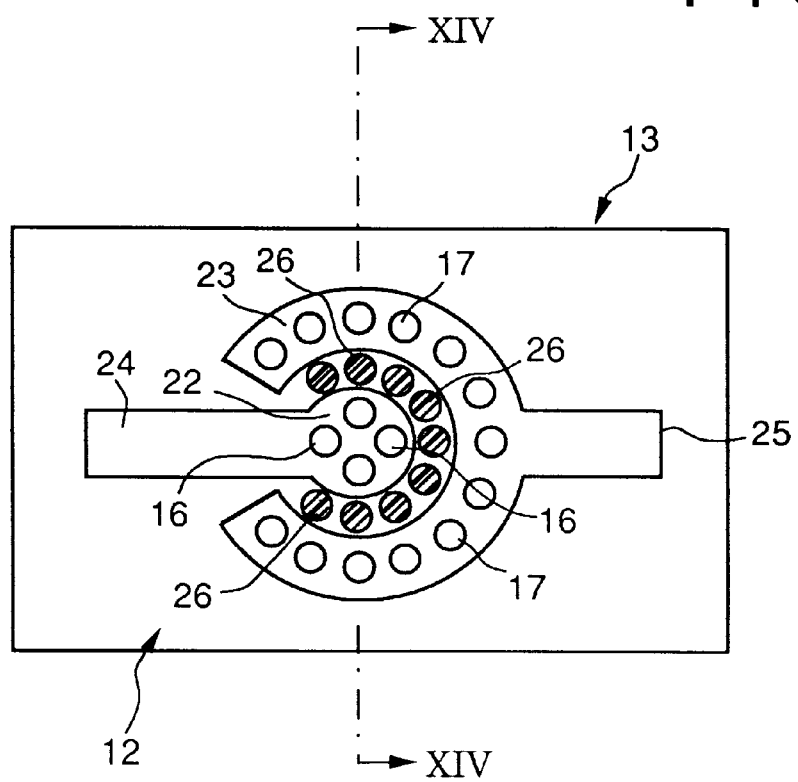
FIG. 22 is a plan view showing the arrangement of a printed capacitor according to a modification of the fifth embodiment.
Figure 23:
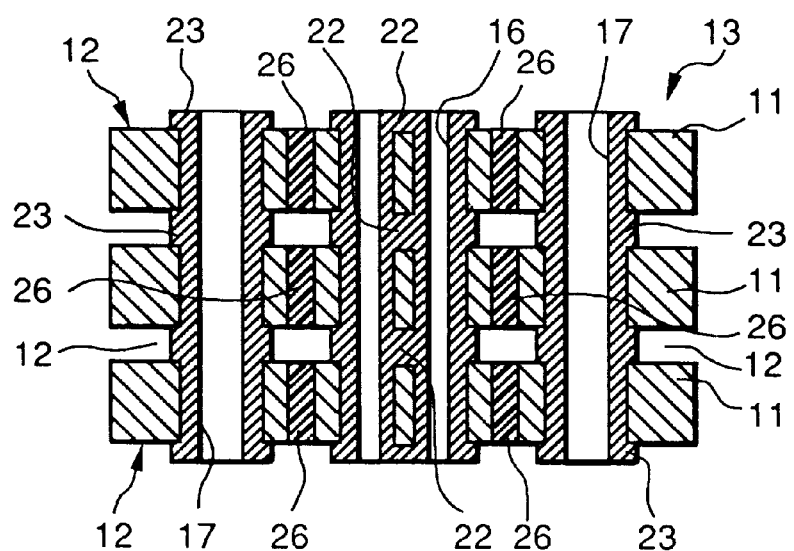
FIG. 23 is a sectional view showing the arrangement, taken along a line XIV—XIV in FIG. 22, of the printed capacitor according to the modification of the fifth embodiment.
Figure 24:
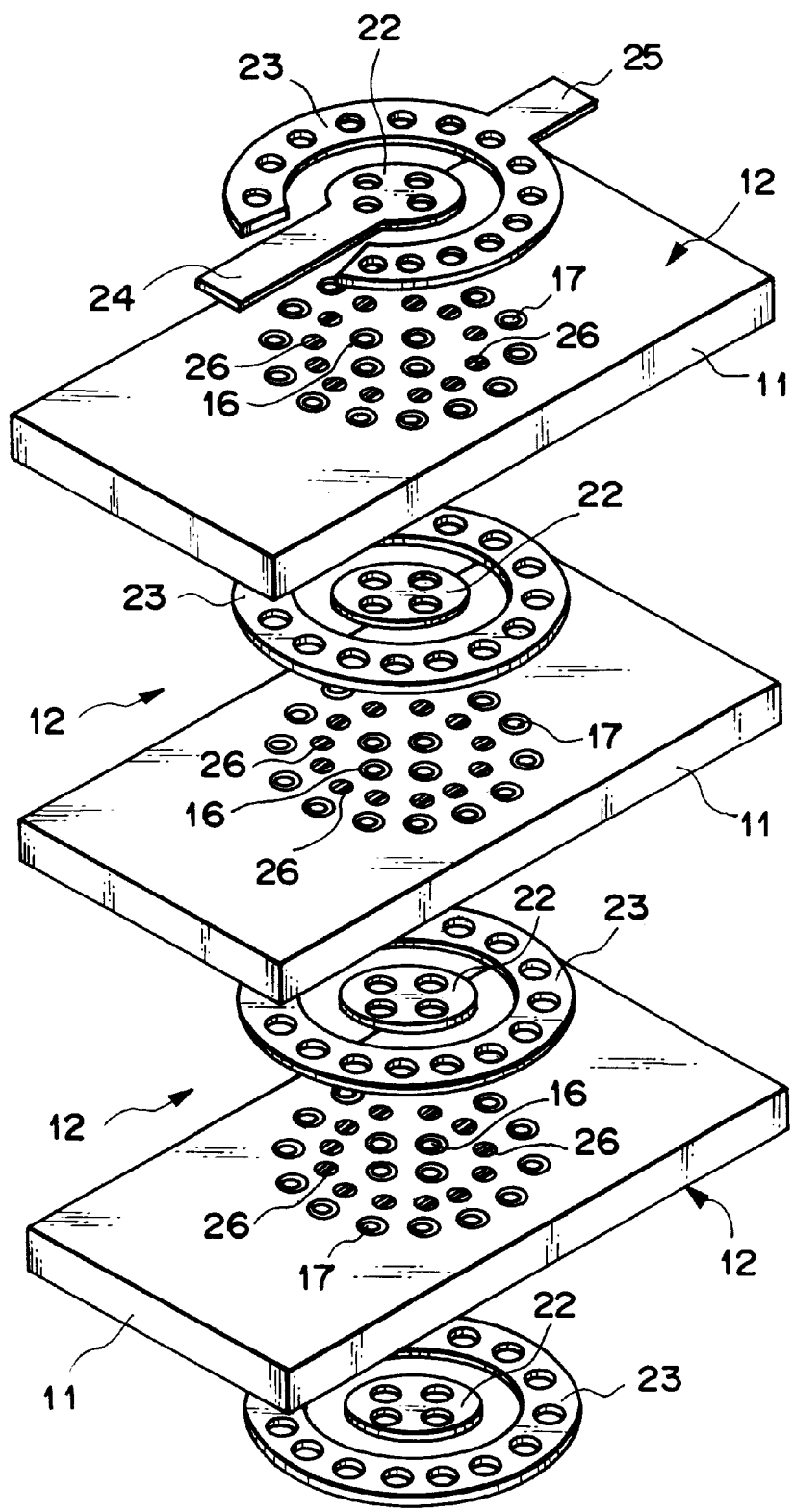
FIG. 24 is an exploded perspective view of the printed capacitor in units of layers according to the modification of the fifth embodiment.

FIG. 22 is a plan view of a printed circuit board according to this modification, FIG. 23 is a sectional view taken along a line XIV—XIV in FIG. 22, and FIG. 24 is an exploded perspective view of the board in units of layers.

More specifically, columnar hole-shaped insulating portions 26, each of which is located at an intermediate position between a pair of opposing plated through-holes 16 and 17, and has a dielectric constant different from that of the surrounding insulating layer 11 (11a, 11b, 11c), are integrally buried in an annular pattern at predetermined angular intervals in the insulating layers (11a, 11b, 11c) of the multi-layered printed circuit board 13. With this arrangement, a printed capacitor with a predetermined electrostatic capacitance can be formed in the multi-layered printed circuit board 13 more easily than in the fourth embodiment, by appropriately selecting the interval between the opposing first and second conductive films 22 and 23, the diameter and number of first and second plated through-holes 16 and 17, and the interval between each two adjacent through-holes, and the like, in addition to the dielectric constants of the insulating layers 11 (11a, 11b, 11c) and the insulating portions 26.

Sixth Embodiment

The sixth embodiment of the present invention will be described below with reference to FIGS. 25A to 25C.

In the sixth embodiment, the substrate 11 is constituted by stacking high-resistance substrate layers 27 and a compound dielectric material layer 28 (see FIG. 25C). Therefore, the compound dielectric material is arranged between the through-hole conductors 16 and 17, as in the above embodiment.

According to the sixth embodiment, the capacitance of the printed capacitor can be adjusted by the number and diameter of the through-hole conductors 16 and 17, the interval between each two adjacent through-hole conductors, or the material of the compound dielectric material layer 28. Therefore, even when a large-capacitance capacitor C6 is to be formed, predetermined surface areas of the conductive films need not be assured unlike in the prior art, and the printed capacitor can be rendered compact.

Modification of Sixth Embodiment

A modification corresponding to the multi-layered arrangement of the circuit board of the sixth embodiment will be explained below.

Figure 26:
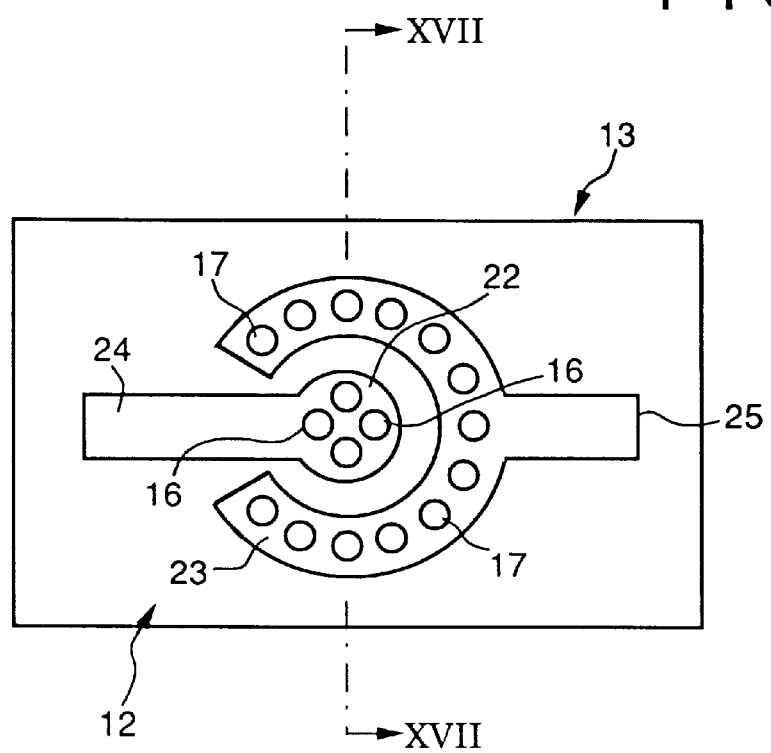
FIG. 26 is a plan view showing the arrangement of a printed capacitor according to a modification of the sixth embodiment.
Figure 27:
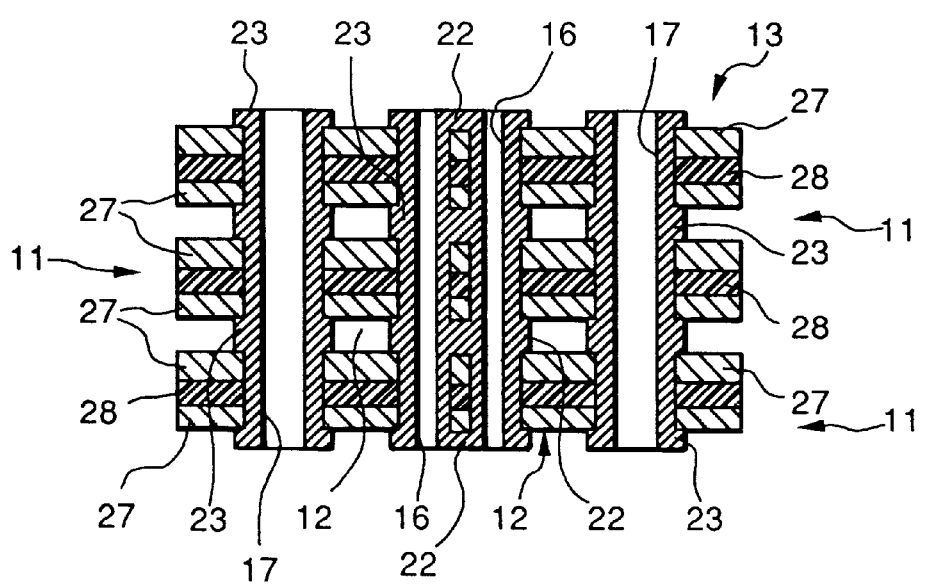
FIG. 27 is a sectional view showing the arrangement, taken along a line XVII—XVII in FIG. 26, of the printed capacitor according to the modification of the sixth embodiment.
Figure 28:
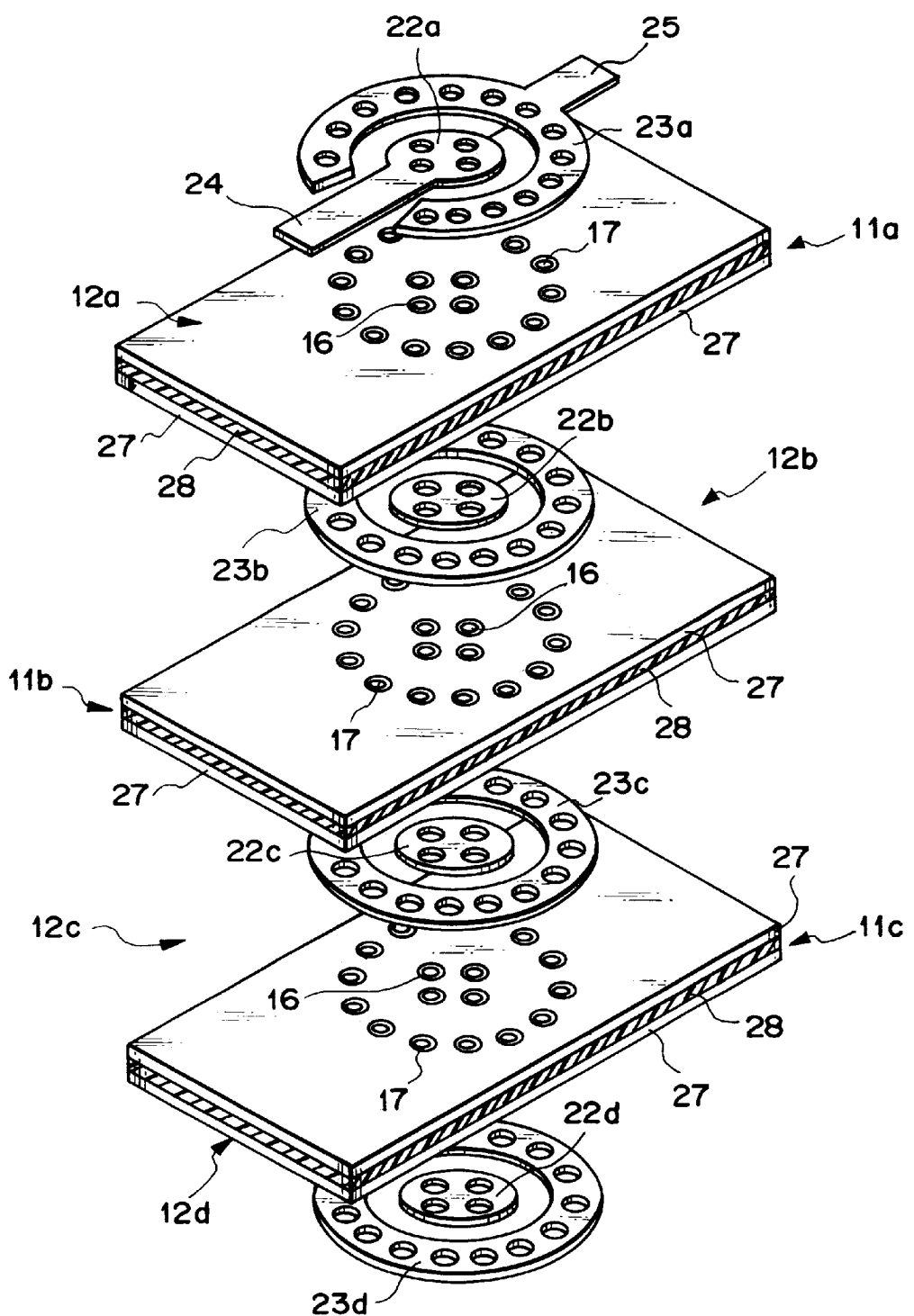
FIG. 28 is an exploded perspective view of the printed capacitor in units of layers according to the modification of the sixth embodiment.

FIG. 26 is a plan view of a circuit board according to this modification, FIG. 27 is a sectional view taken along a line XVII—XVII in FIG. 26, and FIG. 28 is an exploded perspective view of the board in units of layers.

More specifically, each of the insulating layers 11 (11a, 11b, 11c) is constituted by alternately stacking different types of dielectric layers (two different types of layers in FIG. 27) 20 and 21 in three layers. With this arrangement, since the dielectric constant of the insulating layer 11 (11a, 11b, 11c) present between the opposing first and second plated through-holes 16 and 17 can be set to be different from that in the first embodiment, a printed capacitor with a predetermined electrostatic capacitance can be formed on the multi-layered printed circuit board 13 more easily than in the printed capacitor of the fourth embodiment.

Seventh Embodiment

In each of the first to sixth embodiments described above, cylindrical plated through-holes are adopted. Alternatively, elongated holes, which extend along the conductive films of the printed capacitor, may be adopted as the seventh embodiment.

Figure 29A:
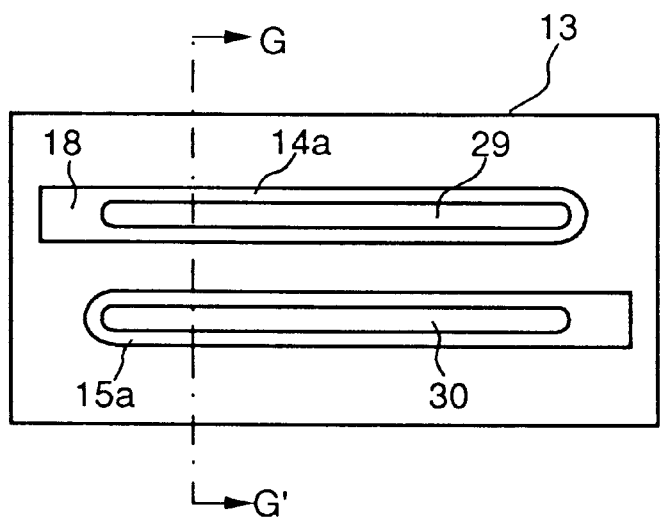
FIG. 29A is a plan view showing the arrangement of a printed capacitor according to the seventh embodiment of the present invention.
Figure 29B:
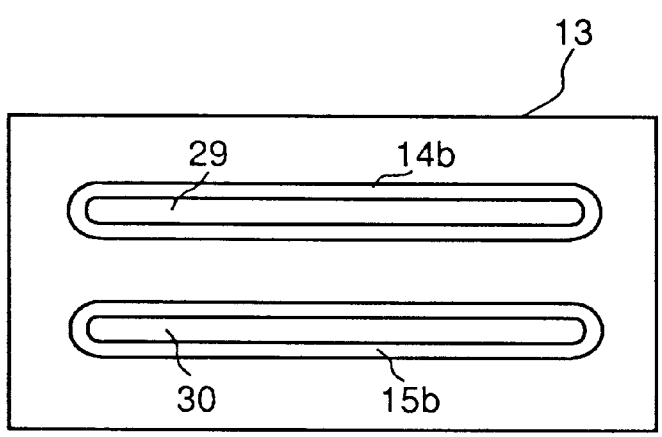
FIG. 29B is a bottom view showing the arrangement of the printed capacitor of the seventh embodiment.
Figure 29C:
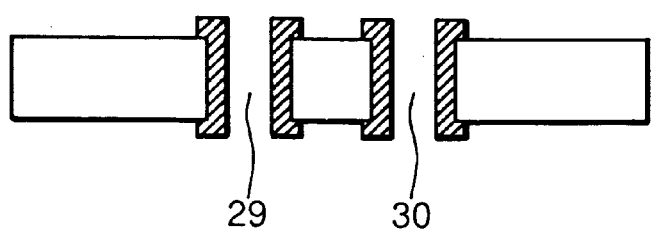
FIG. 29C is a sectional view showing the arrangement, taken along a line G—G in FIG. 29A, of the printed capacitor of the seventh embodiment.

The seventh embodiment of the present invention will be described below with reference to FIGS. 29A to 29C.

In the seventh embodiment, parallel elongated through-hole conductors 29 and 30 are formed, and conductive films 14 and 15 are formed on the surfaces of the board 11 and on the inner surfaces of the through-hole conductors 29 and 30. The conductive film 14 and the through-hole 29 form a first electrode portion, and the conductive film 15 and the through-hole 30 form a second electrode portion.

According to the seventh embodiment, the capacitance of the printed capacitor can be adjusted by the size of the through-hole conductors 29 and 30, and the interval between the through-hole conductors. Therefore, even when a large-capacitance capacitor is to be formed, predetermined surface areas of the conductive films need not be assured unlike in the prior art, and the printed capacitor can be rendered compact.

Modification of Seventh Embodiment

The multi-layered arrangement of the seventh embodiment will be described below.

Figure 30:
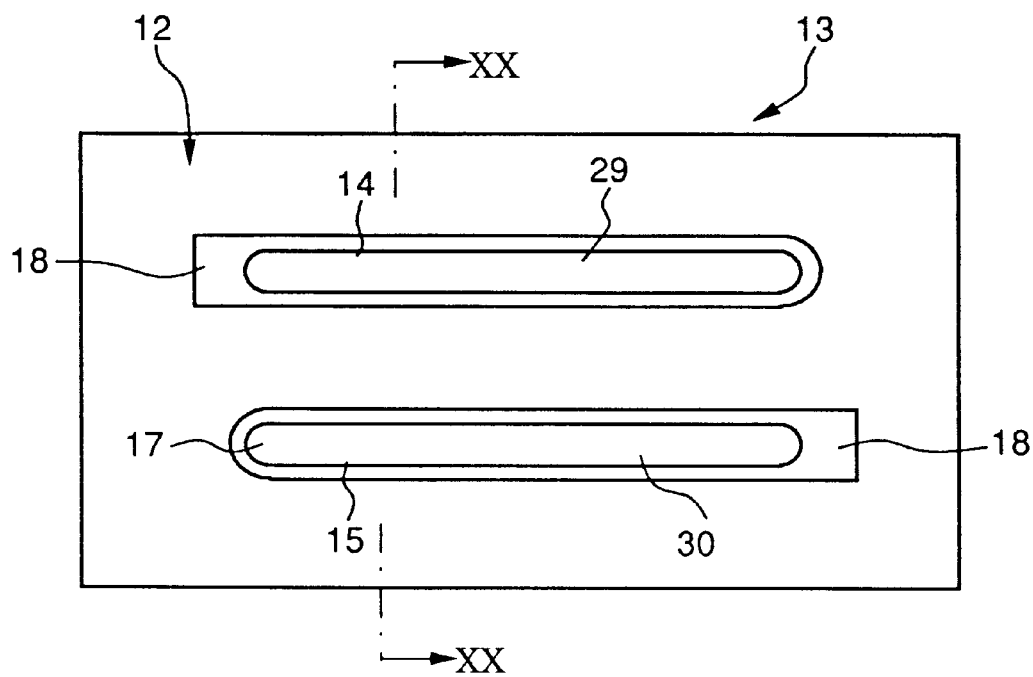
FIG. 30 is a plan view showing the arrangement of a printed capacitor according to a modification of the seventh embodiment.
Figure 31:
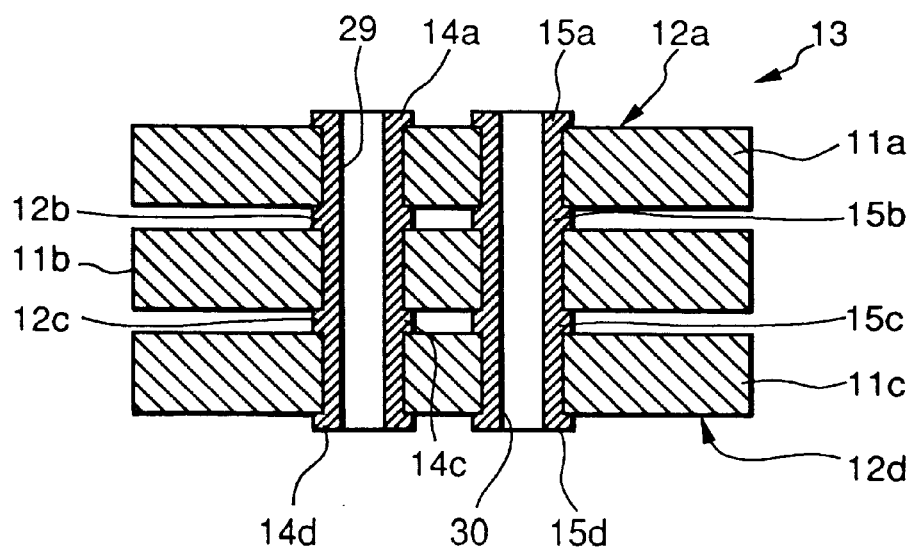
FIG. 31 is a sectional view showing the arrangement, taken along a line XX—XX in FIG. 30, of the printed capacitor according to the modification of the seventh embodiment.
Figure 32:
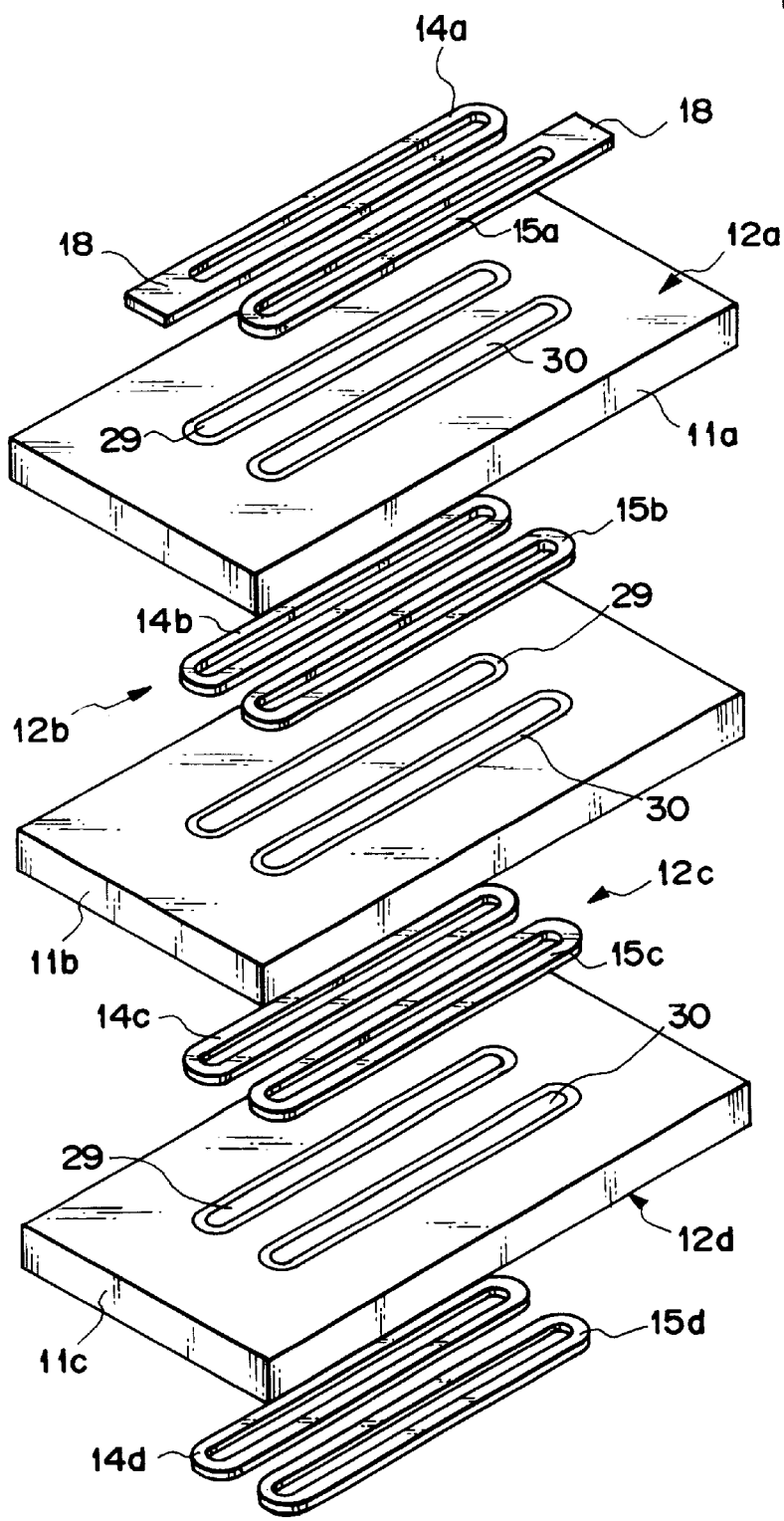
FIG. 32 is an exploded perspective view of the printed capacitor in units of layers according to the modification of the seventh embodiment.

FIG. 30 is a plan view of a circuit board according to a modification of the seventh embodiment, FIG. 31 is a sectional view taken along a line XX—XX in FIG. 30, and FIG. 32 is an exploded perspective view of the board in units of layers.

More specifically, first and second conductive films 14 (14a, 14b, 14c, 14d) and 15 (15a, 15b, 15c, 15d), extending in the longitudinal direction (the right-and-left direction in FIG. 30) of the circuit board 13, are formed on the conductive layers 12 of the multi-layered printed circuit board 13 to be parallel to each other and in the vicinity of each other. The strip-shaped first and second conductive films 14 (14a, 14b, 14c, 14d) and 15 (15a, 15b, 15c, 15d) are respectively connected to first and second elongated through-holes 29 and 30 which extend through the insulating layers 11 (11a, 11b, 11c) of the multi-layered printed circuit board 13, and extend in the longitudinal direction of these conductive films 14 (14a, 14b, 14c, 14d) and 15 (15a, 15b, 15c, 15d).

Therefore, a printed capacitor with a predetermined electrostatic capacitance can be formed in the multi-layered printed circuit board 13 by appropriately selecting the interval between the opposing first and second conductive films 14 (14a, 14b, 14c, 14d) and 15 (15a, 15b, 15c, 15d), the width (minor axis diameter) and the length (major axis diameter) of the first and second plated through-holes 29 and 30, and the like, in addition to the dielectric constant of the insulating layers 11 (11a, 11b, 11c).

Eighth Embodiment

The eighth embodiment of the present invention will be described below with reference to FIGS. 33A to 33C.

A printed capacitor according to the eighth embodiment is constituted by a first electrode portion (22 and 24) and a second electrode portion (23 and 25) arranged to surround the first electrode portion. The first electrode portion has a through-hole 30, and the second electrode portion has a through-hole 31 which is concentrically formed to surround the first electrode portion.

According to the eighth embodiment, the capacitance of the printed capacitor can be adjusted by the size of the through-holes 30 and 31, and the interval between the through-hole conductors. Therefore, even when a large-capacitance capacitor is to be formed, predetermined surface areas of the conductive films need not be assured unlike in the prior art, and the printed capacitor can be rendered compact.

Ninth Embodiment

In the first to eighth embodiments described above, the conductive films of the printed capacitor are formed on all the conductive layers 12 of the multi-layered printed circuit board 13. Alternatively, the conductive films may be formed on only some of conductive layers 12 as a ninth embodiment.

Figure 34:
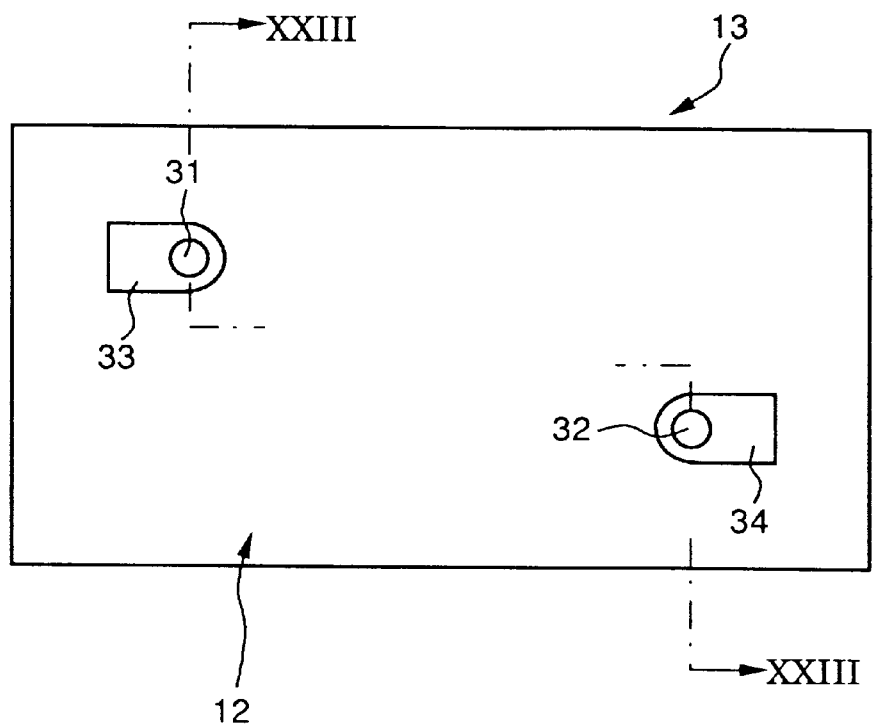
FIG. 34 is a plan view showing the arrangement of a printed capacitor according to the ninth embodiment of the present invention.
Figure 35:
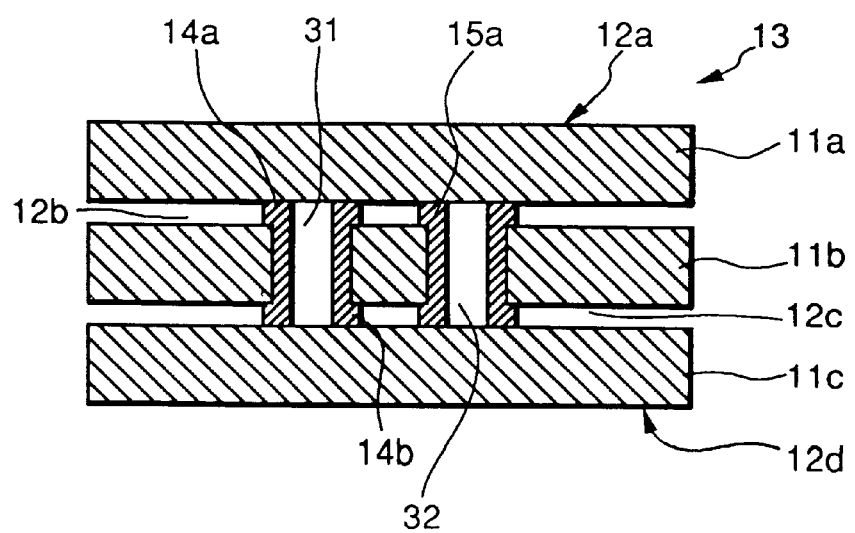
FIG. 35 is a sectional view showing the arrangement, taken along a line XXIII—XXIII in FIG. 34, of the printed capacitor according to the ninth embodiment.
Figure 36:
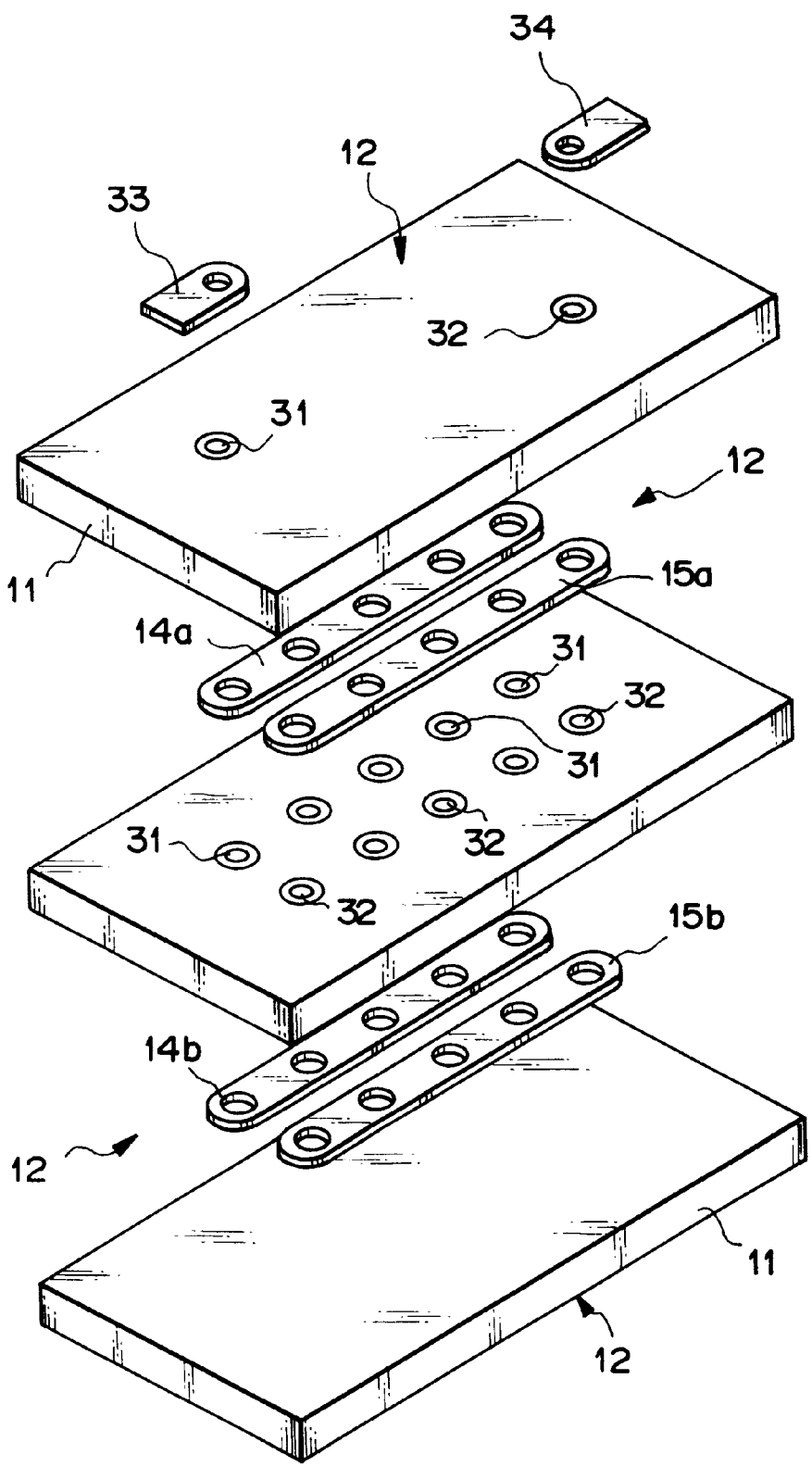
FIG. 36 is an exploded perspective view of the printed capacitor in units of layers according to the ninth embodiment.

FIG. 34 is a plan view showing a printed circuit board of the ninth embodiment, FIG. 35 is a sectional view taken along a line XXIII—XXIII in FIG. 34, and FIG. 36 is an exploded perspective view of the board in units of layers.

More specifically, first and second conductive films 14 (14a, 14b) and 15 (15a, 15b), extending in the longitudinal direction (the right-and-left direction in FIG. 34) of the circuit board 13, are formed on the second and third conductive layers 12 of the multi-layered printed circuit board 13 to be parallel to each other and in the vicinity of each other. These strip-shaped first and second conductive films 14 (14a, 14b) and 15 (15a, 15b) are respectively connected to first and second plated through-holes 31 and 32, which are arranged at predetermined intervals and extend through the intermediate insulating layer (the second insulating layer in FIG. 35) of the multi-layered printed circuit board 13. The first plated through-hole 31 which is located at one end side (the left side in FIG. 34) of the first conductive film 14 (14a, 14b) extends through the upper insulating layer 11a of the multi-layered printed circuit board 13 in FIG. 35, and is connected to an electrical connection film 33 formed on the uppermost conductive layer 12. Similarly, the second plated through-hole 32 located at the other end (the right side in FIG. 34) of the second conductive film 15 (15a, 15b) extends through the upper insulating layer 11a of the multi-layered printed circuit board 13 in FIG. 35, and is connected to an electrical connection film 34 formed on the uppermost conductive layer 12.

As described above, in the ninth embodiment, since the electrode films of the printed capacitor are formed not on all the conductive layers 12, a wider assembling space for other electrical circuits, electronic parts, and the like can be assured.

Note that the present invention is applicable to printed capacitors with other structures obtained by appropriately combining the techniques of the above-mentioned first to eighth embodiments.

As described above, according to the present invention, the capacitance of the capacitor can be adjusted by, e.g., the number and diameter of conductors such as through-holes, the interval between each two adjacent through-holes, or the material of the compound dielectric material, and the capacitance need not be adjusted by the area of conductive films unlike in the prior art. Therefore, capacitors can have almost the same sizes independently of their capacitances, and do not require large occupation areas on the substrate surface even when a large-capacitance capacitor is to be formed. For this reason, the printed circuit board can be rendered compact.

As many apparently widely different embodiments of the present invention can be made without departing from the spirit and scope thereof, it is to be understood that the invention is not limited to the specific embodiments thereof except as defined in the appended claims.

What is claimed is:

1. A printed circuit board, comprising:
   first and second electrode members arranged to oppose each other;
   a first conductor member electrically connected to said first electrode member, said first conductor member being formed as a through-hole in a direction of thickness of the circuit board;
   a second conductor member electrically connected to said second electrode member, said second conductor member being formed as a through-hole in the direction of thickness of the circuit board; and
   a charge accumulation member formed between the through-hole of said first conductor member and the through-hole of said second conductor member and having a predetermined dielectric constant, with an electric field of said charge accumulation member formed in a direction perpendicular to the direction of thickness of the circuit board,
   wherein said first and second conductor members and said charge accumulation member form an embedded capacitor.

2. The printed circuit board according to claim 1, wherein said charge accumulation member is a portion of said circuit board.

3. The printed circuit board according to claim 1, wherein said first electrode member has a substantially circular electrode, and a plurality of said first conductor members are formed along an outer perimeter of said circular electrode, and
   said second electrode member has a substantially annular electrode which surrounds said first electrode member and a plurality of said second conductor members are formed along the annular pattern of said annular electrode.

4. The printed circuit board according to claim 1, further comprising a dielectric member extending in the direction of thickness of said circuit board and formed between said first conductor member formed on an electrode line of said first electrode member, and said second conductor member, corresponding to said first conductor member, formed on an electrode line of said second electrode member.

5. The printed circuit board according to claim 4, wherein a dielectric constant of said dielectric member is higher than a dielectric constant of a material of said circuit board.

6. The printed circuit board according to claim 1, wherein said first electrode member has a substantially circular electrode, and a plurality of said first conductor members are formed along an outer perimeter of said circular electrode,
   said second electrode member has a substantially annular electrode which surrounds said first electrode member and a plurality of said second conductor members are formed along the annular pattern of said annular electrode, and
   a dielectric member extending in the direction of thickness of said circuit board is formed in an annular gap between said first and second electrode member.

7. The printed circuit board according to claim 6, wherein a dielectric constant of said dielectric member is higher than a dielectric constant of a material of aid circuit board.

8. The printed circuit board according to claim 1, wherein a dielectric member having a predetermined dielectric constant is formed in a direction of plane of said circuit board in a portion between an arbitrary one first conductor member formed on an electrode line of said first electrode member, and one second conductor member, corresponding to said arbitrary one first conductor member, of said second conductor members formed on an electrode line of said second electrode member, so that said dielectric member is sandwiched between portions of said circuit board.

9. The printed circuit board according to claim 8, wherein a dielectric constant of said dielectric member is higher than a dielectric constant of a material of said circuit board.

10. The printed circuit board according to claim 1, wherein said first electrode member has an elongated shape, and said first conductor member is an elongated through-hole formed in said first electrode member.

11. A printed circuit board, comprising:
    primary and secondary surfaces arranged to oppose each other;
    a first electrode having a first primary electrode line and a second primary electrode line formed to extend on said primary surface of said circuit board;
    a second electrode having a first secondary electrode line and a second secondary electrode line formed to extend on said secondary surface of said circuit board;
    a first conductor member for electrically connecting said first primary and secondary electrode lines, said first conductor member being formed as through-holes in a direction of thickness of said circuit board at a plurality of positions on said first primary electrode line on said primary surface and said first secondary electrode line on said secondary surface;
    a second conductor member for electrically connecting said second primary and secondary electrode lines, said second conductor member being formed as through-holes in a direction of thickness of said circuit board at a plurality of positions on said second primary electrode line on said primary surface and said second secondary electrode line on said secondary surface; and
    a charge accumulation member formed between the through-holes of said first conductor member and the through-holes of said second conductor member and having a predetermined dielectric constant, wherein said charge accumulation member serves as an embedded capacitor.

12. A printed circuit board, comprising:
    a primary surface on which first electrode members are arranged and a secondary surface on which second electrode members are arranged, said first and second electrode members being arranged to oppose each other;
    a first conductor member electrically connected to said first electrode member, said first conductor member being formed as a through-hole in a direction of thickness of said circuit board;
    a second conductor member electrically connected to said second electrode member, said second conductor member being formed as a through-hole to extend in the direction of thickness of said circuit board; and
    a charge accumulation member formed between the through-hole of said first conductor member and the through-hole of said second conductor member and having a predetermined dielectric constant, wherein said charge accumulation member serves as an embedded capacitor, wherein said first and second electrode members have an elongated shape, and a plurality of said first and second conductor members are formed at predetermined intervals along a longitudinal direction of said first and second electrode members.

13. A printed circuit board, comprising:

at least first and second stacked insulating layers;

first and second electrode layers formed on two outermost surface layers of said stacked insulating layers and an intermediate layer formed between said stacked insulating layers;

opposing first and second primary electrode members formed on said first electrode layer, and opposing first and second secondary electrode members formed on said second electrode layer;

a plurality of first conductor members, each of which electrically connects said first primary and secondary electrode members, said first conductor member being formed as a through-hole in a direction of thickness of said circuit board;

a plurality of second conductor members, each of which electrically connects said second primary and secondary electrode members, said second conductor member being formed as a through-hole in a direction of thickness of said circuit board; and a charge accumulation member formed between the through-hole of said first conductor members and the through-hole of said second conductor members and having a predetermined dielectric constant, with an electric field of said charge accumulation member formed in a direction perpendicular to the direction of thickness of the circuit board, wherein the through-hole of said first conductor members and the through-hole of said second conductor members and said charge accumulation member therebetween form an embedded capacitor.

14. The printed circuit board according to claim 13, wherein said charge accumulation member is a portion of said circuit board.

15. The printed circuit board according to claim 13, wherein said first primary and said first secondary electrode members have substantially circular electrodes, and said plurality of first conductor members are formed along outer perimeters of said circular electrodes, and said second primary and said second secondary electrode members have substantially annular electrodes which surround said first primary and said first secondary electrode members, and said plurality of second conductor members are formed along annular patterns of said annular electrodes.

16. The printed circuit board according to claim 13, further comprising a dielectric member extending in the direction of thickness of the circuit board formed between an arbitrary one of said first conductor members formed between said first primary and said first secondary electrode members, and one, corresponding to said arbitrary first conductor member, of said second conductor members formed between said second primary and said second secondary electrode members.

17. The printed circuit board according to claim 16, wherein a dielectric constant of said dielectric member is higher than a dielectric constant of a material of said circuit board.

18. The printed circuit board according to claim 13, wherein said first primary and said first secondary electrode members have substantially circular first electrodes, and said plurality of first conductor members are formed along outer perimeters of said first electrodes, said second primary and said second secondary electrode members have substantially annular second electrodes which surround said first primary and said first secondary electrode members, and said plurality of second conductor members are formed along annular patterns of said second electrodes, and a dielectric member extending in the direction of thickness of said circuit board is formed in an annular gap between said first and second electrodes.

19. The printed circuit board according to claim 18, wherein a dielectric constant of said dielectric member is higher than a dielectric constant of a material of said circuit board.

20. The printed circuit board according to claim 13, wherein a dielectric member having a predetermined dielectric constant is formed in a direction of plane of said circuit board in a portion between an arbitrary one of said plurality of first conductor members formed between said first primary and said first secondary electrode members, and one, corresponding to said arbitrary one first conductor member, of said plurality of second conductor members formed between said second primary and said second secondary electrode members, so that said dielectric member is sandwiched between portions of said circuit board.

21. The printed circuit board according to claim 20, wherein a dielectric constant of said dielectric member is higher than a dielectric constant of a material of said circuit board.

22. The printed circuit board according to claim 13, wherein said first primary and said first secondary electrode members have an elongated shape, and said first conductor members comprise an elongated through-hole formed between said first primary and said first secondary electrode members.

23. A printed circuit board, comprising:

at least first and second stacked insulating layers;

first and second electrode layers formed on two outermost surface layers of said stacked insulating layers and an intermediate layer formed between said stacked insulating layers;

opposing first and second primary electrode members formed on said first electrode layer, and opposing first and second secondary electrode members formed on said second electrode layer;

a plurality of first conductor members, each of which electrically connects said first primary and secondary electrode members, said first conductor member being formed as a through-hole in a direction of thickness of said circuit board;

a plurality of second conductor members, each of which electrically connects said second primary and secondary electrode members, said second conductor member being formed as a through-hole in a direction of thickness of said circuit board; and a charge accumulation member formed between the through-hole of said first conductor members and the through-hole of said second conductor members, and having a predetermined dielectric constant, wherein said first primary and secondary electrode members, and said second primary and secondary electrode members have an elongated shape, and said plurality of first and second conductor members are formed at predetermined intervals in a longitudinal direction of said first and second primary and secondary electrode members.

* * * * *

UNITED STATES PATENT AND TRADEMARK OFFICE
CERTIFICATE OF CORRECTION

PATENT NO. : 5,973,929

DATED : October 26, 1999

INVENTOR(S): TOMOYASU ARAKAWA, ET AL.

It is certified that error appears in the above-identified patent and that said Letters Patent is hereby corrected as shown below:

COLUMN 1:

Line 5, "1997," should read --1995,--.

COLUMN 17:

Line 67, "aid" should read --said--.

Signed and Sealed this

Sixth Day of February, 2001

Attest:

Q. TODD DICKINSON

Attesting Officer

Director of Patents and Trademarks